US012680963B2

(12) United States Patent
Gladnick et al.

(10) Patent No.: US 12,680,963 B2
(45) Date of Patent: Jul. 14, 2026

(54) MACHINE VISION SYSTEM UTILIZING AUTOFOCUS AND INSPECTION PROCESSES

(71) Applicant: Mitutoyo Corporation, Kanagawa-ken (JP)

(72) Inventors: Paul Gerard Gladnick, Seattle, WA (US); Dmitri Anatolyevich Tsyboulski, Seattle, WA (US); Jerry R. Mccormick, Mill Creek, WA (US); Mark Lawrence Delaney, Beaverton, OR (US)

(73) Assignee: Mitutoyo Corporation, Kanagawa-Ken (JP)

( * ) Notice: Subject to any disclaimer, the term of this patent is extended or adjusted under 35 U.S.C. 154(b) by 95 days.

(21) Appl. No.: 18/936,835

(22) Filed: Nov. 4, 2024

(65) Prior Publication Data

US 2025/0146949 A1      May 8, 2025

Related U.S. Application Data

(60) Provisional application No. 63/596,939, filed on Nov. 7, 2023.

(51) Int. Cl.
*G01N 21/88* (2006.01)
*G02B 7/09* (2021.01)
(Continued)

(52) U.S. Cl.
CPC .......... *G01N 21/8806* (2013.01); *G02B 7/09* (2013.01); *G02B 7/102* (2013.01); *G03F 7/706849* (2023.05); *G01N 2021/8809* (2013.01)

(58) Field of Classification Search
CPC ....... G01N 21/8806; G01N 2021/8809; G02B 7/09; G02B 7/102; G03F 7/706849
See application file for complete search history.

(56) References Cited

U.S. PATENT DOCUMENTS 4,336,997 A      6/1982   Röss et al.
4,950,878 A      8/1990   Ulich et al.
(Continued)

FOREIGN PATENT DOCUMENTS

CN      111325785 A      6/2020
CN      108106603 B      8/2020
(Continued)

OTHER PUBLICATIONS

Mermillod-Blondin et al., "High-speed varifocal imaging with a tunable acoustic gradient index of refraction lens," Optics Letters 33(18):2146-2148, 2008.
(Continued)

*Primary Examiner* — Kara E. Geisel
*Assistant Examiner* — Christina I Xing
(74) *Attorney, Agent, or Firm* — Seed Intellectual Property Law Group LLP

(57) ABSTRACT

A machine vision system includes a vision components portion and an inspection portion. The inspection portion includes a variable focal length (VFL) lens, a VFL lens controller, an inspection portion light source, an inspection portion objective lens, and an inspection portion camera. The vision components portion performs an autofocus process which indicates z-heights of a plurality of sampling points on a surface of a workpiece for determining coarse surface profile data. The inspection portion thereafter performs an inspection process, which comprises acquiring an extended depth of field (EDOF) image for each inspection point of a plurality of inspection points on the surface of the
(Continued)

workpiece, and for which an inspection scan path is followed which includes adjustments in relation to the distance between the inspection portion and the surface of the workpiece and is determined based at least in part on the coarse surface profile data from the autofocus process.

20 Claims, 17 Drawing Sheets

(51) Int. Cl.
| | | |
|---|---|---|
| *G02B 7/10* | (2021.01) | |
| *G03F 7/00* | (2006.01) | |

(56) References Cited

U.S. PATENT DOCUMENTS

| | | | |
|---|---|---|---|
| 6,184,974 | B1 | 2/2001 | Neal et al. |
| 6,542,180 | B1 | 4/2003 | Wasserman et al. |
| 6,996,291 | B2 | 2/2006 | Nahum |
| 7,003,161 | B2 | 2/2006 | Tessadro |
| 7,030,351 | B2 | 4/2006 | Wasserman et al. |
| 7,085,431 | B2 | 8/2006 | Jones et al. |
| 7,127,159 | B2 | 10/2006 | Gladnick et al. |
| 7,301,133 | B2 | 11/2007 | Weiss |
| 7,324,682 | B2 | 1/2008 | Wasserman |
| 7,454,053 | B2 | 11/2008 | Bryll et al. |
| 7,499,584 | B2 | 3/2009 | Delaney |
| 7,522,763 | B2 | 4/2009 | Tessadro |
| 7,567,713 | B2 | 7/2009 | Ding |
| 7,570,795 | B2 | 8/2009 | Yu et al. |
| 7,627,162 | B2 | 12/2009 | Blanford et al. |
| 7,723,657 | B2 | 5/2010 | Altendorf et al. |
| 7,728,961 | B2 | 6/2010 | Watson |
| 7,885,480 | B2 | 2/2011 | Bryll et al. |
| 8,111,905 | B2 | 2/2012 | Campbell |
| 8,111,938 | B2 | 2/2012 | Bryll et al. |
| 8,194,251 | B2 | 6/2012 | Emtman et al. |
| 8,194,307 | B2 | 6/2012 | Arnold et al. |
| 8,605,291 | B2 | 12/2013 | Tobiason |
| 8,692,880 | B2 | 4/2014 | Tobiason |
| 9,013,574 | B2 | 4/2015 | Saylor et al. |
| 9,080,855 | B2 | 7/2015 | Nahum et al. |
| 9,143,674 | B2 | 9/2015 | Gladnick |
| 9,213,175 | B2 | 12/2015 | Arnold |
| 9,256,009 | B2 | 2/2016 | Theriault et al. |
| 9,444,995 | B2 | 9/2016 | Northrup et al. |
| 9,726,876 | B2 | 8/2017 | Bryll |
| 9,736,355 | B1 | 8/2017 | Bryll |
| 9,740,190 | B2 | 8/2017 | Bryll |
| 9,774,765 | B2 | 9/2017 | Bryll et al. |
| 9,830,694 | B2 | 11/2017 | Bryll |
| 9,930,243 | B2 | 3/2018 | Gladnick et al. |
| 9,983,459 | B2 | 5/2018 | Arnold |
| 10,101,572 | B2 | 10/2018 | Bryll et al. |
| 10,151,962 | B2 | 12/2018 | Gladnick et al. |
| 10,178,321 | B2 | 1/2019 | Emtman et al. |
| 10,520,650 | B2 | 12/2019 | Freerksen et al. |
| 10,880,468 | B1 | 12/2020 | Bryll |
| 10,892,693 | B2 | 1/2021 | Devos et al. |
| 11,002,529 | B2 | 5/2021 | Nahum |
| 11,119,382 | B2 | 9/2021 | Gladnick |
| 11,249,225 | B2 | 2/2022 | Gladnick |
| 11,328,409 | B2 | 5/2022 | Emtman |
| 11,499,817 | B2 | 11/2022 | Eiles |
| 11,860,602 | B2 | 1/2024 | Yu et al. |
| 2004/0223053 | A1 | 11/2004 | Gladnick et al. |
| 2006/0211802 | A1 | 9/2006 | Asgari |
| 2010/0137990 | A1 | 6/2010 | Apatsidis et al. |
| 2016/0025903 | A1 | 1/2016 | Arnold |
| 2017/0052425 | A1 | 2/2017 | Arnold |
| 2017/0078549 | A1 | 3/2017 | Emtman et al. |
| 2018/0088440 | A1* | 3/2018 | Gladnick ............... H04N 23/72 |
| 2020/0209519 | A1* | 7/2020 | Gladnick ............. H04N 17/002 |
| 2022/0138976 | A1 | 5/2022 | Campbell et al. |
| 2023/0032656 | A1 | 2/2023 | Laman |
| 2024/0060904 | A1* | 2/2024 | Lee .................... G01N 21/9501 |

FOREIGN PATENT DOCUMENTS

| | | | |
|---|---|---|---|
| DE | 102017207176 | A1 | 11/2017 |
| DE | 102017217320 | B4 | 10/2022 |
| EP | 1475627 | A2 | 11/2004 |
| EP | 1533996 | B1 | 12/2006 |
| WO | WO 2009120718 | A1 | 10/2009 |

OTHER PUBLICATIONS

Mitutoyo Corporation & Micro Encoder Inc., "QVPAK—3D CNC Vision Measuring Machine—User's Guide," Manual No. 99MCB225A, Version 7, Series No. 359, Jan. 2003. (326 pages).
Williams et al., Circuit Designs 3, Collected Circards, IPC Business Press, Ltd., London, UK, 1978, pp. 1-144 (146 pages).

* cited by examiner

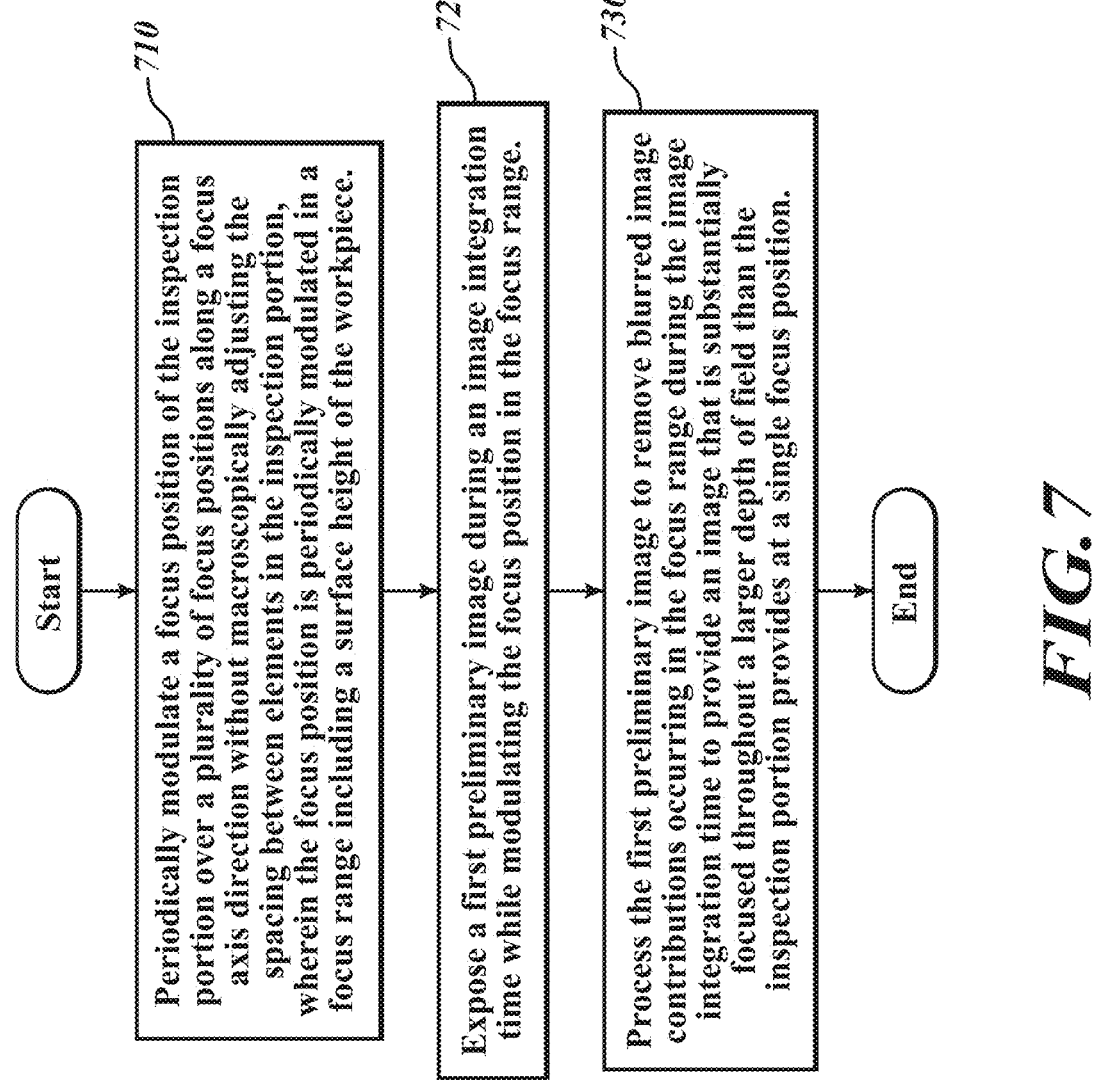

Start

Periodically modulate a focus position of the inspection portion over a plurality of focus positions along a focus axis direction without macroscopically adjusting the spacing between elements in the inspection portion, wherein the focus position is periodically modulated in a focus range including a surface height of the workpiece.

710

Expose a first preliminary image during an image integration time while modulating the focus position in the focus range.

720

Process the first preliminary image to remove blurred image contributions occurring in the focus range during the image integration time to provide an image that is substantially focused throughout a larger depth of field than the inspection portion provides at a single focus position.

730

End

*FIG. 7*

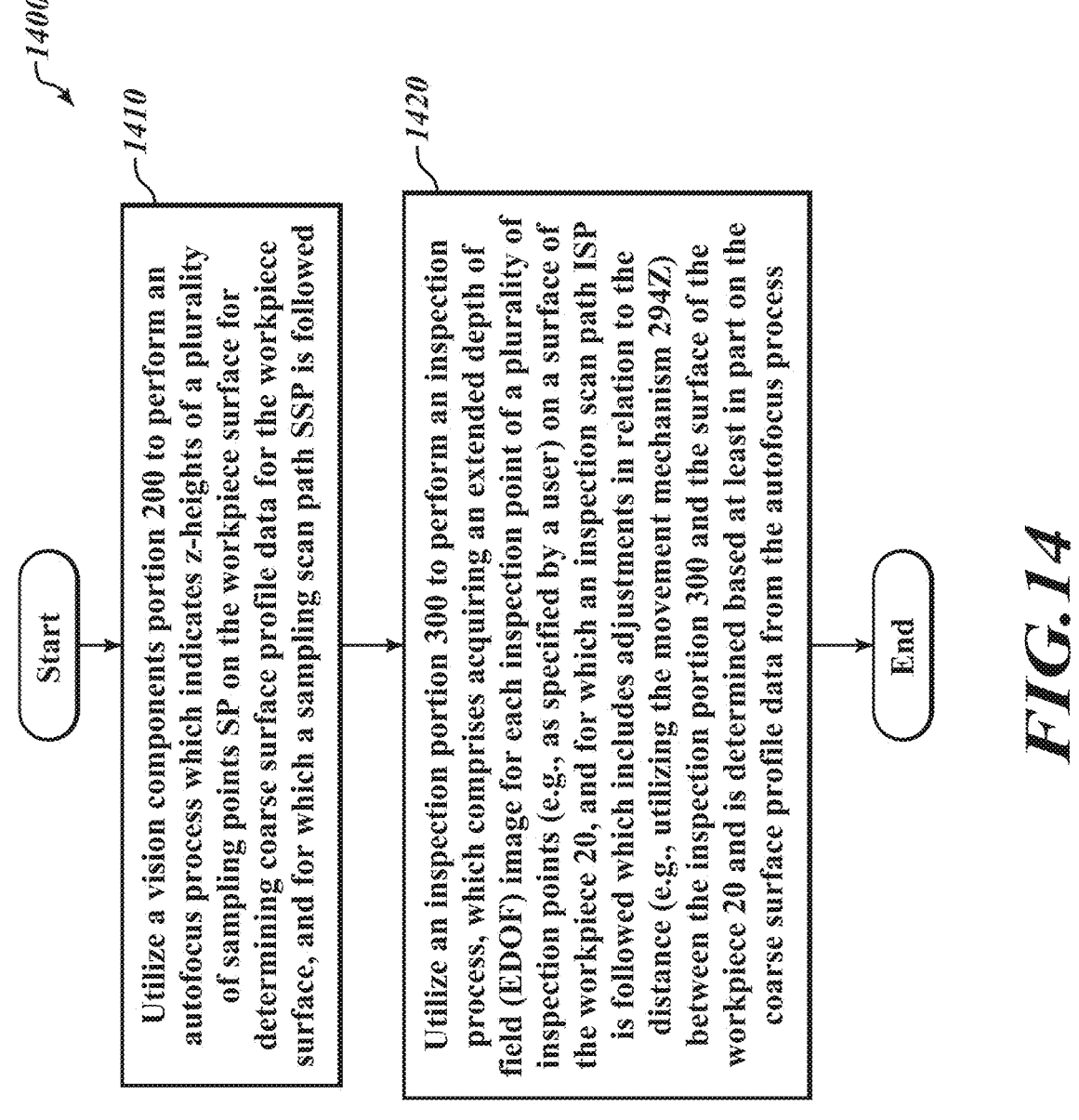

1400

1410

Start

Utilize a vision components portion 200 to perform an autofocus process which indicates z-heights of a plurality of sampling points SP on the workpiece surface for determining coarse surface profile data for the workpiece surface, and for which a sampling scan path SSP is followed

1420

Utilize an inspection portion 300 to perform an inspection process, which comprises acquiring an extended depth of field (EDOF) image for each inspection point of a plurality of inspection points (e.g., as specified by a user) on a surface of the workpiece 20, and for which an inspection scan path ISP is followed which includes adjustments in relation to the distance (e.g., utilizing the movement mechanism 294Z) between the inspection portion 300 and the surface of the workpiece 20 and is determined based at least in part on the coarse surface profile data from the autofocus process End

*FIG. 14*

MACHINE VISION SYSTEM UTILIZING AUTOFOCUS AND INSPECTION PROCESSES

BACKGROUND

Technical Field

This disclosure relates to precision metrology and, more particularly, to a machine vision system utilizing an autofocus process in combination with an inspection process (e.g., which acquires extended depth of field images).

Description of the Related Art

Precision non-contact metrology systems such as precision machine vision systems (or "vision systems" for short) may be utilized to obtain precise dimensional measurements of objects and to inspect various other object characteristics, and may include a computer, a camera, an optical system with an objective lens, and a precision stage that moves to allow workpiece traversal and inspection. One exemplary prior art system is the QUICK VISION® series of PC-based vision systems and QVPAK® software available from Mitutoyo America Corporation (MAC), located in Aurora, Illinois. The features and operation of the QUICK VISION® series of vision systems and the QVPAK® software are generally described, for example, in the QVPAK 3D CNC Vision Measuring Machine User's Guide, published January 2003, which is hereby incorporated by reference in its entirety. This type of system uses a microscope-type optical system including an objective lens and moves the stage and/or optical system to provide inspection images of workpieces.

Quality control of workpieces that include specific surface profiles, such as those produced by etching, molding and/or machining, is becoming increasingly demanding in terms or throughput, measurement resolution, and accuracy. For example, in large-scale manufacturing of electronic components there is a need to perform non-contact inspection of parts or components deposited onto not perfectly flat substrates. Inspection processes require detection of sub-micrometer size defects in these parts and demand high throughput. In relation to such requirements, systems and configurations that may improve or otherwise enhance machine vision systems (e.g., in relation to improved capabilities and/or characteristics to quickly and accurately inspect surface profiles of various workpieces) would be desirable.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one aspect, a machine vision system is provided which includes a vision components portion comprising an optical assembly portion; a movement mechanism; and an inspection portion that is coupled to the optical assembly portion. The inspection portion includes a variable focal length (VFL) lens; a VFL lens controller configured to control the VFL lens to periodically modulate an optical power of the VFL lens over a range of optical powers at an operating frequency so as to periodically modulate a focus position of the inspection portion; an inspection portion light source which is configured to provide source light for illuminating a workpiece; an inspection portion objective lens having an optical axis OA' and that is configured to input workpiece light arising from the workpiece, and to transmit the workpiece light along an imaging optical path OPATH' that passes through the VFL lens, wherein the optical axis OA' corresponds to a z-axis direction for which surface points on a surface of the workpiece have corresponding z-heights along the z-axis direction; and an inspection portion camera that is configured to receive the workpiece light transmitted by the VFL lens along the imaging optical path OPATH' and to provide a corresponding workpiece image exposure.

The vision components portion is configured to be utilized to perform an autofocus process which indicates z-heights of a plurality of sampling points SP on the surface of the workpiece for determining coarse surface profile data for the surface of the workpiece, and for which a sampling scan path SSP is followed. The inspection portion is configured to be utilized to perform an inspection process, which comprises acquiring an extended depth of field (EDOF) image for each inspection point IP of a plurality of inspection points IP on the surface of the workpiece, and for which an inspection scan path ISP is followed. The inspection scan path ISP includes adjustments in relation to the distance between the inspection portion and the surface of the workpiece and is determined based at least in part on the coarse surface profile data from the autofocus process.

In accordance with another aspect, a method is provided for operating a machine vision system. The machine vision system includes a vision components portion comprising an optical assembly portion; a movement mechanism; and an inspection portion that is coupled to the optical assembly portion. The inspection portion includes a variable focal length (VFL) lens; a VFL lens controller configured to control the VFL lens to periodically modulate an optical power of the VFL lens over a range of optical powers at an operating frequency so as to periodically modulate a focus position of the inspection portion; an inspection portion light source which is configured to provide source light for illuminating a workpiece; an inspection portion objective lens having an optical axis OA' and that is configured to input workpiece light arising from the workpiece, and to transmit the workpiece light along an imaging optical path OPATH' that passes through the VFL lens, wherein the optical axis OA' corresponds to a z-axis direction for which surface points on a surface of the workpiece have corresponding z-heights along the z-axis direction; and an inspection portion camera that is configured to receive the workpiece light transmitted by the VFL lens along the imaging optical path OPATH' and to provide a corresponding workpiece image exposure.

The method includes generally two steps. A first step includes utilizing the vision components portion to perform an autofocus process. The autofocus process indicates z-heights of a plurality of sampling points SP on the surface of the workpiece for determining coarse surface profile data for the surface of the workpiece, for which a sampling scan path SSP is followed. A second step includes utilizing the inspection portion to perform an inspection process. The inspection process comprises acquiring an extended depth of field (EDOF) image for each inspection point IP of a plurality of inspection points IP on the surface of the workpiece, for which an inspection scan path ISP is followed. The inspection scan path ISP includes adjustments in relation to the distance between the inspection portion and the surface of the workpiece and is determined based at least in part on the coarse surface profile data from the autofocus process.

According to yet another aspect, a metrology system is provided which includes a vision components portion comprising an optical assembly portion; a movement mechanism; an inspection portion that is coupled to the optical assembly portion; a memory for storing programmed instructions; and one or more processors to execute the programmed instructions to perform operations. The inspection portion includes a variable focal length (VFL) lens; a VFL lens controller configured to control the VFL lens to periodically modulate an optical power of the VFL lens over a range of optical powers at an operating frequency so as to periodically modulate a focus position of the inspection portion; an inspection portion light source which is configured to provide source light for illuminating a workpiece; an inspection portion objective lens having an optical axis OA' and that is configured to input workpiece light arising from the workpiece, and to transmit the workpiece light along an imaging optical path OPATH' that passes through the VFL lens, wherein the optical axis OA' corresponds to a z-axis direction for which surface points on a surface of the workpiece have corresponding z-heights along the z-axis direction; and an inspection portion camera that is configured to receive the workpiece light transmitted by the VFL lens along the imaging optical path OPATH' and to provide a corresponding workpiece image exposure.

The one or more processors, in operation, execute the programmed instructions to perform operations including:

utilizing the vision components portion to perform an autofocus process which indicates z-heights of a plurality of sampling points SP on the surface of the workpiece for determining coarse surface profile data for the surface of the workpiece, and for which a sampling scan path SSP is followed; and utilizing the inspection portion to perform an inspection process, which comprises acquiring an extended depth of field (EDOF) image for each inspection point IP of a plurality of inspection points IP on the surface of the workpiece, and for which an inspection scan path ISP is followed which includes adjustments in relation to the distance between the inspection portion and the surface of the workpiece and is determined based at least in part on the coarse surface profile data from the autofocus process.

BRIEF DESCRIPTION OF THE DRAWINGS

FIG. 7 is a flow diagram illustrating a method for operating an inspection portion for obtaining an extended depth of field (EDOF) image.

FIG. 14 is a flow diagram illustrating a method for operating a machine vision system including a step of utilizing the vision components portion to perform an autofocus process and a step of utilizing the inspection portion to perform an inspection process.

DETAILED DESCRIPTION

Figure 1:
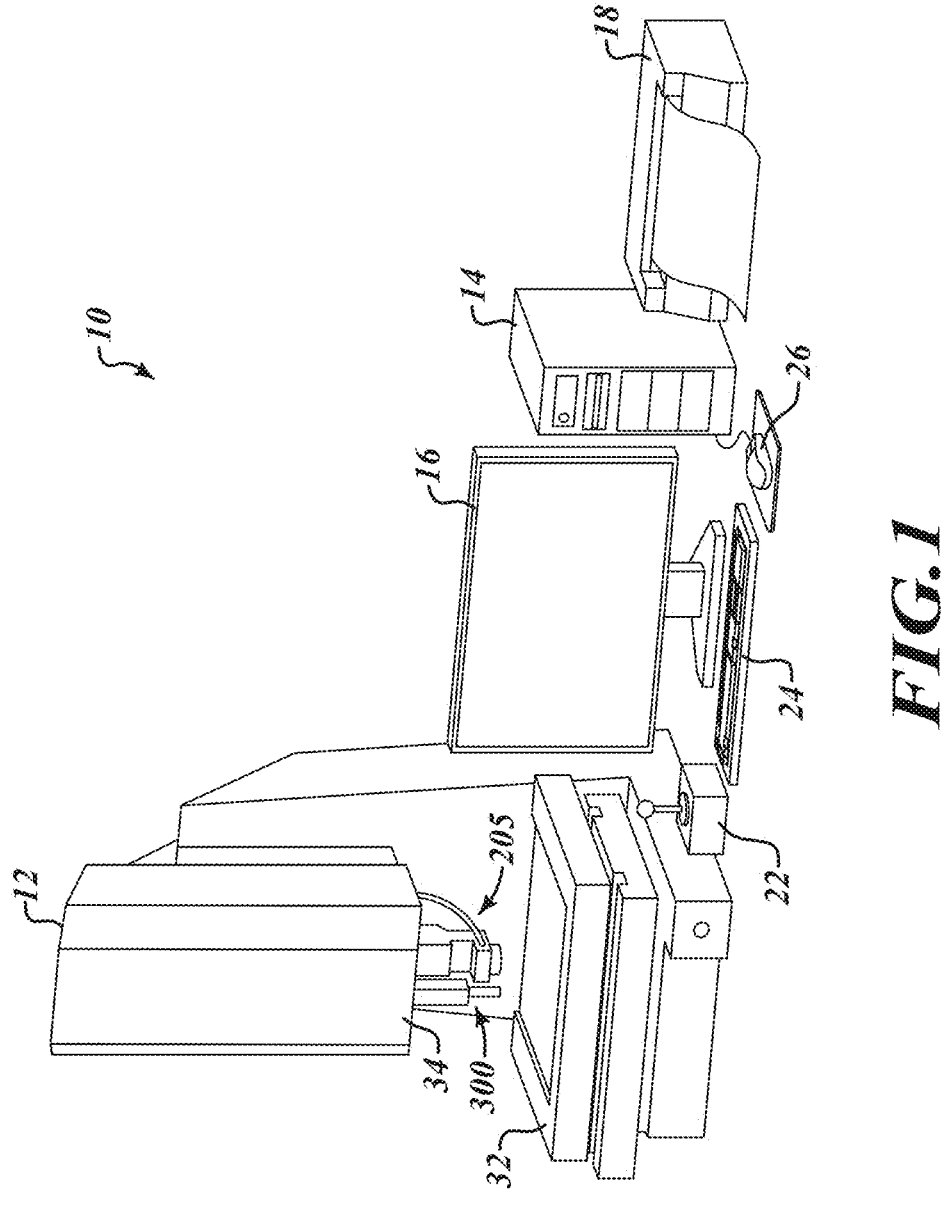
FIG. 1 is a diagram showing components of a machine vision system.

FIG. 1 is a block diagram of one exemplary machine vision system 10. The machine vision system 10 includes a vision measuring machine 12 that is operably connected to exchange data and control signals with a controlling computer system 14. The controlling computer system 14 is further operably connected to exchange data and control signals with a monitor or display 16, a printer 18, a joystick 22, a keyboard 24, and a mouse 26. The monitor or display 16 may display a user interface suitable for controlling and/or programming the operations of the machine vision system 10. It will be appreciated that in various implementations, a touchscreen tablet or other computing elements or the like may be substituted for and/or redundantly provide the functions of any or all of the elements 14, 16, 22, 24 and 26.

Those skilled in the art will appreciate that the controlling computer system 14 and/or control system portion 120 (FIG. 2) and/or other control portions or components as described herein may generally be implemented using any suitable computing system or device, including distributed or networked computing environments, and the like. Such computing systems or devices may include one or more general-purpose or special-purpose processors (e.g., non-custom or custom devices) that execute software to perform the functions described herein. Software may be stored in memory, such as random-access memory (RAM), read-only memory (ROM), flash memory, or the like, or a combination of such components. Software may also be stored in one or more storage devices, such as optical-based disks, flash memory devices, or any other type of non-volatile storage medium for storing data. Software may include one or more program modules that include routines, programs, objects, components, data structures, and so on that perform particular tasks or implement particular abstract data types. In distributed computing environments, the functionality of the program modules may be combined or distributed across multiple computing systems or devices and accessed via service calls, either in a wired or wireless configuration.

Figure 2:
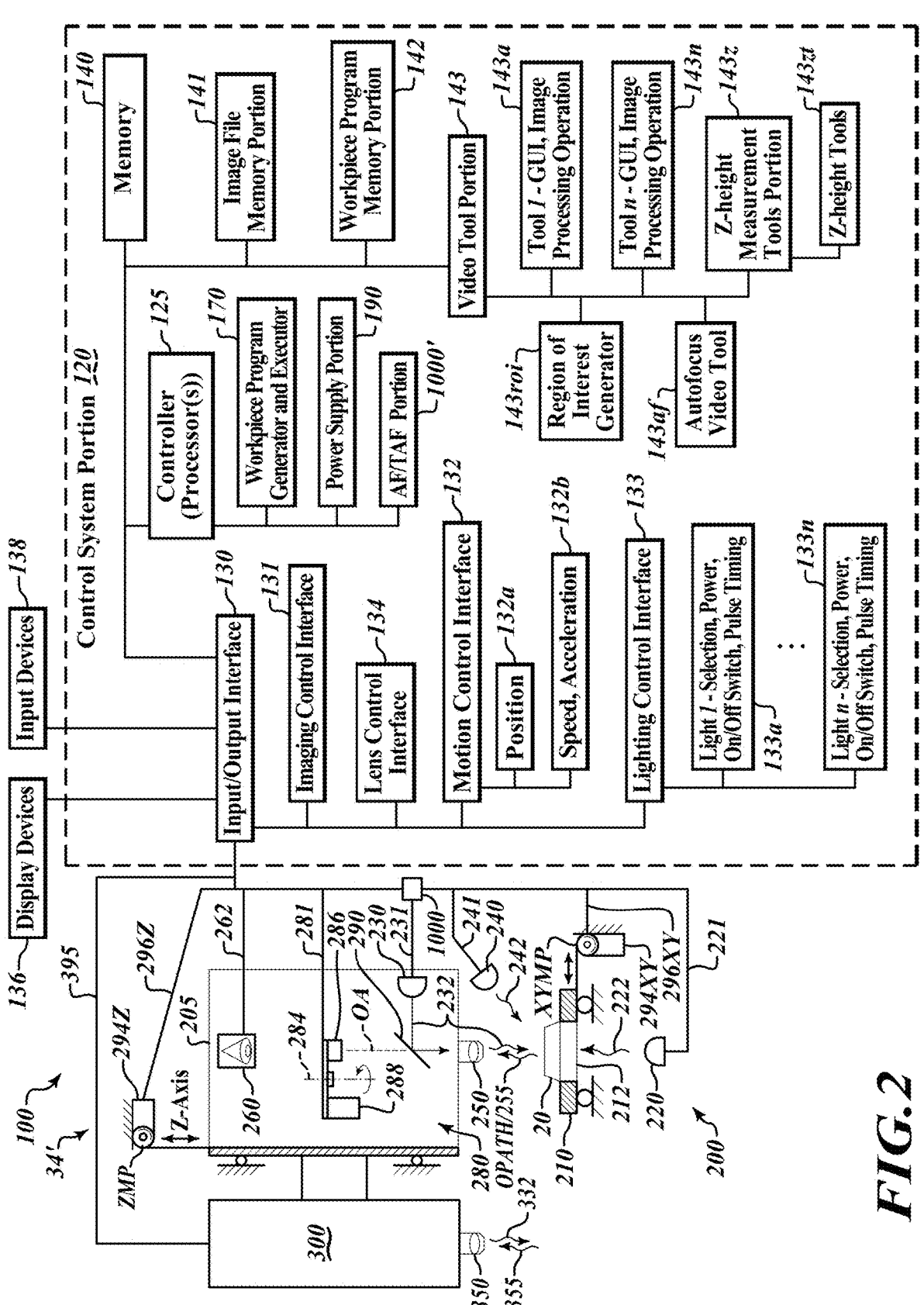
FIG. 2 is block diagram of a control system portion, a vision components portion, and an inspection portion, all of a machine vision system similar to that of FIG. 1.

The vision measuring machine 12 includes a moveable workpiece stage 32 and an optical imaging system 34 (e.g., as part of a vision components portion 200, and as including an optical assembly portion 205, FIG. 2) that may include a zoom lens or interchangeable objective lenses. In various implementations, the workpiece stage 32 may be movable (e.g., in x-axis and/or y-axis directions) to move a workpiece, etc. that is located on the workpiece stage relative to the optical imaging system 34. The zoom lens or interchangeable objective lenses generally provide various magnifications for the images provided by the optical imaging system 34. Certain aspects of the machine vision system 10 are also described in U.S. Pat. Nos. 7,454,053; 7,324,682; 8,111,905; and 8,111,938, each of which is hereby incorporated herein by reference in its entirety. As will be described in more detail below, in various implementations, an inspection portion 300 (e.g., including a variable focal length (VFL) lens and configured to obtain extended depth of field (EDOF) images, etc.) may be coupled (e.g., attached and/or mounted, etc.) to part of the optical imaging system 34 (e.g., to an optical assembly portion 205, FIG. 2) and/or may otherwise be part of the optical imaging system 34. In such implementations, the workpiece stage 32 may also be movable (e.g., in x-axis and/or y-axis directions) to move a workpiece, etc. that is located on the workpiece stage relative to the inspection portion 300.

As will be described in more detail below, one main goal of a machine vision system as described herein is speed, i.e., to be able to quickly scan over workpieces (e.g., quickly moving along the workpiece or workpieces in the x-axis/y-axis direction) including utilizing a variable focal length (VFL) lens (e.g., for performing inspection operations to capture extended depth of field (EDOF) images). One technical problem encountered is that if the workpiece has a lot of variance in height in the z-axis direction, such variance might be greater than the focus range corresponding to the operation of the VFL lens at the required optical resolution, for which it will be appreciated that higher resolution associated with higher numerical apertures may greatly reduce the focus range of the VFL lens. Then, as scanning is performed over the workpiece (e.g., by moving in the x-axis/y-axis directions to each of a plurality of inspection points), certain sections of the workpiece may fall out of the focus range (i.e., corresponding to the operation of the VFL lens), such that desired EDOF images of those sections may not be able to be obtained (e.g., due to being out of the focus range). Certain prior systems may have addressed such issues by determining and making z-height adjustments at each inspection point to keep each inspection point within the focus range (i.e., corresponding to the operation of the VFL lens), however this would greatly reduce throughput.

To address such issues, as will be described in more detail below, a machine vision system as described herein may first utilize a vision components portion 200 to perform an autofocus process which indicates z-heights of a plurality of sampling points SP on the surface of the workpiece for determining coarse surface profile data. Then, the system may utilize an inspection portion 300 (e.g., including a VFL lens such as a TAG lens) to perform an inspection process, which comprises acquiring an extended depth of field (EDOF) image for each inspection point on the surface of the workpiece, and for which an inspection scan path is followed. The inspection scan path includes adjustments in relation to the distance between the inspection portion and the surface of the workpiece (e.g., to keep the distance within the focus range) and is determined based at least in part on the coarse surface profile data from the autofocus process.

FIG. 2 is a block diagram of a control system portion 120, a vision components portion 200 and an inspection portion 300 of a machine vision system 100 similar to the machine vision system of FIG. 1, including certain features disclosed herein. As will be described in more detail below, the control system portion 120 is utilized to control the vision components portion 200 and may also be coupled to be utilized to control at least part of the inspection portion 300. The control system portion 120 may be arranged to exchange data and control signals with the vision components portion 200 and/or the inspection portion 300.

The inspection portion 300 will be described in more detail below with respect to FIG. 5. Briefly, an inspection portion light source may emit/provide source light 332 to illuminate a workpiece or workpieces 20 located on the stage 210 (e.g., when the workpiece 20 is located beneath inspection portion 300). The source light 332 is reflected or transmitted from the workpiece 20 as image light 355, and the image light used for imaging passes through an inspection portion objective lens 350, for utilization as part of the operations of the inspection portion 300, as will be described in more detail below. In various implementations, the inspection portion 300 may be configured to acquire extended depth of field (EDOF) images, and may include a variable focal length (VFL) lens 370 (FIG. 5), e.g., a tunable acoustic gradient (TAG) lens that creates a lensing effect using sound waves in a fluid medium, such as that disclosed in U.S. Pat. Nos. 9,143,674 and 9,830,694, each of which is hereby incorporated herein by reference in its entirety. In various implementations, the inspection portion 300 may be coupled to the control system portion 120 through associated signal lines (e.g., as part of a bus 395).

The vision components portion 200 includes an optical imaging system 34' and a workpiece stage 210 (e.g., which may be similar or identical to the optical imaging system 34 and the stage 32 of FIG. 1). In some implementations, at least part of the workpiece stage 210 may be implemented as a conveyor that one or more workpieces 20 are located on and moved by (e.g., to pass under the optical imaging system 34' for imaging). In various implementations, the optical imaging system 34' includes at least an optical assembly portion 205 and one or more light sources (e.g., light sources 220, 230, and/or 240).

In the example of FIG. 2, the workpiece stage 210 includes a central transparent portion 212 and is controllably movable along x- and/or y-axes that lie in a plane that is generally parallel to the surface of the stage where a workpiece 20 may be positioned. The workpiece stage 210 is controllably movable along the x- and/or y-axes by a movement mechanism 294XY configured to change a stage position of the workpiece stage 210 relative to at least part of the imaging system 34'. In various implementations, the workpiece stage 210 may also or alternatively be controllably movable along the z-axis by using the movement mechanism 294XY. In various implementations, the movement mechanism 294XY (e.g., a controllable motor) may drive an actuator to move the workpiece stage 210 (e.g., to move the workpiece 20) relative to the optical assembly portion 205 including the objective lens 250 of the imaging system 34' (e.g., so that a field of view (FOV) of the optical assembly portion 205 of the imaging system is moved to different parts of the workpiece 20, etc. for acquiring different images at different image positions, such as for acquiring images of different features of the workpiece 20). It will be appreciated that similar operations and movements may be made in relation to the operations of the inspection portion 300.

An encoder-based measurement portion XYMP (e.g., as included in or attached to the movement mechanism 294XY or otherwise coupled to or proximate to the workpiece stage 210) includes one or more position encoders, and provides position measurements indicative of the position of the workpiece stage 210 (e.g., relative to the optical assembly portion 205 and/or the inspection portion 300). The movement mechanism 294XY (e.g., a controllable motor) and the encoder-based measurement portion XYMP are connected to an input/output interface 130 via a signal line 296XY (e.g., which may include separate signal line portions for providing control signals to and/or for receiving signals from the movement mechanism 294XY and the encoder-based measurement portion XYMP).

The optical assembly portion 205 includes a camera system 260 and an interchangeable optical assembly objective lens 250. In various implementations, the optical assembly portion 205 may further include a turret lens assembly 280 having lenses 286 and 288. As an alternative to the turret lens assembly, in various implementations a fixed or manually interchangeable magnification-altering lens, or a zoom lens configuration, or the like, may be included. In various implementations, the interchangeable optical assembly objective lens 250 may be selected from a set of fixed magnification objective lenses that are included as part of a variable magnification lens portion (e.g., a set of objective lenses corresponding to magnifications such as 0.5×, 1×, 2× or 2.5×, 5×, 10×, 20× or 25×, 50×, 100×, etc.).

The optical assembly portion 205 and/or the inspection portion 300 are controllably movable along a z-axis that is generally orthogonal to the x- and y-axes by using a movement mechanism 294Z (e.g., a controllable motor) that drives an actuator to move the optical assembly portion 205 and/or the inspection portion 300 along the z-axis (e.g., to change a focus of an image of the workpiece 20). In various implementations, the optical assembly portion 205 and/or the inspection portion 300 may also or alternatively be controllably movable along the x- and/or y-axes by using the movement mechanism 294Z. An encoder-based measurement portion ZMP (e.g., as included in or attached to the movement mechanism 294Z or otherwise coupled to or proximate to the optical assembly portion 205 and/or the inspection portion 300) includes one or more position encoders, and provides position measurements indicative of the position of the optical assembly portion 205 and/or the inspection portion 300 (e.g., relative to the stage 210 on which the workpiece 20 is located). The movement mechanism 294Z and the encoder-based measurement portion ZMP are connected to an input/output interface 130 via a signal line 296Z (e.g., which may include separate signal line portions for providing control signals to and/or for receiving signals from the movement mechanism 294Z and the encoder-based measurement portion ZMP). For example, the control signals may be provided through the input/output interface 130 to control the movement mechanism 294Z to move the optical assembly portion 205 and/or the inspection portion 300 (e.g., to change a focus of an image, such as to change a focus position of the objective lens 250 or 350 relative to the workpiece 20). In various implementations, separate movement mechanisms (e.g., similar to the movement mechanism 294Z) may be included and utilized for each of the optical assembly portion 205 and the inspection portion 300 for separately/independently moving each along the z-axis direction (e.g., in implementations where it may be desirable to have independent control/motion along the z-axis direction for each).

For the operations of the optical assembly portion 205, one or more of a stage light source 220, a coaxial light source 230, and a surface light source 240 (e.g., a ring light) may emit source light 222, 232, and/or 242, respectively, to illuminate the workpiece or workpieces 20. For example, during an image exposure, the coaxial light source 230 may emit source light 232 along a path including a beam splitter 290 (e.g., a partial mirror). The source light 232 is reflected or transmitted from the workpiece 20 as image light 255, and the image light used for imaging passes through the optical assembly objective lens 250, and the turret lens assembly 280, and is gathered by the camera system 260. A workpiece image exposure which includes the image of the workpiece(s) 20, is captured by the camera system 260 (e.g., including a pixel array), and is output on a signal line 262 to the control system portion 120. In addition to carrying image data, the signal line 262 may carry signals from the controller 125 for controlling the camera system 260 (e.g., for initiating image acquisition, etc.)

Various light sources (e.g., the light sources 220, 230, 240) may be connected to a lighting control interface 133 of the control system portion 120 through associated signal lines (e.g., the busses 221, 231, 241, respectively). The control system portion 120 may control the turret lens assembly 280 to rotate along axis 284 to select a turret lens (e.g., having a magnification of 1×, 2×, 4×, or 6×, etc.) through a signal line or bus 281 to alter an image magnification.

As shown in FIG. 2, in various exemplary implementations, the control system portion 120 includes a controller 125 (e.g., comprising or operating as part of one or more processors), the input/output interface 130, a memory 140, a workpiece program generator and executor 170, and a power supply portion 190. Each of these components, as well as the additional components described below, may be interconnected by one or more data/control busses and/or application programming interfaces, or by direct connections between the various elements. In various implementations, the memory 140 is coupled to the one or more processors (e.g., of the controller 125) and stores program instructions that when executed by the one or more processors cause the one or more processors to perform operations and/or functions as described herein.

The input/output interface 130 includes an imaging control interface 131, a motion control interface 132, a lighting control interface 133, and the lens control interface 134. The motion control interface 132 may include a position control element 132a, and a speed/acceleration control element 132b although such elements may be merged and/or indistinguishable. The lighting control interface 133 may include lighting control elements 133a-133n, that control, for example, the selection, power, and on/off switch for various corresponding light sources of the machine vision system 100.

The memory 140 may include an image file memory portion 141, a workpiece program memory portion 142 that may include one or more part programs, or the like, and a video tool portion 143. Certain machine vision systems generally utilize automated video inspection. U.S. Pat. No. 6,542,180 (the '180 patent) teaches various aspects of such automated video inspection and is incorporated herein by reference in its entirety. As taught in the '180 patent, automated video inspection metrology instruments generally have a programming capability that allows an automatic inspection event sequence to be defined by the user for each particular workpiece configuration. This can be implemented by text-based programming, for example, or through a recording mode which progressively "learns" the inspection event sequence by storing a sequence of machine control instructions corresponding to a sequence of inspection operations performed by a user with the aid of a graphical user interface, or through a combination of both methods. Such a recording mode is often referred to as "learn mode" or "training mode." Once the inspection event sequence is defined in "learn mode," such a sequence can then be used to automatically acquire (and additionally analyze or inspect) images of a workpiece during "run mode."

The machine control instructions including the specific inspection event sequence (i.e., how to acquire each image and how to analyze/inspect each acquired image) are generally stored as a "part program" or "workpiece program" that is specific to the particular workpiece configuration. For example, a part program defines how to acquire each image, such as how to position the camera relative to the workpiece, at what lighting level, at what magnification level, etc. Further, the part program defines how to analyze/inspect an acquired image, for example, by using one or more video tools such as edge/boundary detection video tools.

Video tools (or "tools" for short) and other graphical user interface features may be used manually to accomplish manual inspection and/or machine control operations (in "manual mode"). Their set-up parameters and operation can also be recorded during learn mode, in order to create automatic inspection programs, or "part programs". Video tools may include, for example, edge/boundary detection tools, autofocus tools, shape or pattern matching tools, dimension measuring tools, and the like.

The video tool portion 143 includes video tool portion 143a and other video tool portions (e.g., 143n) that determine the GUI, image-processing operation, etc., for each of the corresponding video tools, and a region of interest (ROI) generator 143roi that supports automatic, semi-automatic, and/or manual operations that define various ROIs that are operable in various video tools included in the video tool portion 143. Examples of the operations of such video tools for locating edge features and performing other workpiece feature inspection operations are described in more detail in certain of the previously incorporated references, as well as in U.S. Pat. No. 7,627,162, which is hereby incorporated herein by reference in its entirety.

The video tool portion 143 also includes an autofocus video tool 143af that determines the GUI, image-processing operation, etc., for focus height measurement operations. In various implementations, the autofocus video tool 143af may additionally include a high-speed focus height tool that may be utilized to measure focus heights with high speed, as described in more detail in U.S. Pat. No. 9,143,674, which is hereby incorporated herein by reference in its entirety. In various implementations, the high-speed focus height tool may be a special mode of the autofocus video tool 143af that may otherwise operate according to conventional methods for autofocus video tools, or the operations of the autofocus video tool 143af may only include those of the high-speed focus height tool. High-speed autofocus and/or focus position determination for an image region or regions of interest may be based on analyzing the image to determine a corresponding quantitative contrast metric for various regions, according to known methods. For example, such methods are disclosed in U.S. Pat. Nos. 8,111,905; 7,570, 795; and 7,030,351, each of which is hereby incorporated herein by reference in its entirety.

In the context of this disclosure, and as is known by one of ordinary skill in the art, the term "video tool" generally refers to a relatively complex set of automatic or programmed operations that a machine vision user can implement through a relatively simple user interface. For example, a video tool may include a complex pre-programmed set of image-processing operations and computations that are applied and customized in a particular instance by adjusting a few variables or parameters that govern the operations and computations. In addition to the underlying operations and computations, the video tool comprises the user interface that allows the user to adjust those parameters for a particular instance of the video tool. It should be noted that the visible user interface features are sometimes referred to as the video tool, with the underlying operations being included implicitly.

In general, the memory portion 140 stores data usable to operate the vision system components portion 200 to capture or acquire an image of the workpiece 20 such that the acquired image of the workpiece 20 has desired image characteristics. The memory portion 140 may also contain data defining a graphical user interface operable through the input/output interface 130. The memory portion 140 may also store inspection result data, may further store data usable to operate the machine vision system 100 to perform various inspection and measurement operations on the acquired images (e.g., implemented, in part, as video tools), either manually or automatically, and to output the results through the input/output interface 130.

One or more display devices 136 (e.g., the display 16 of FIG. 1) and one or more input devices 138 (e.g., the joystick 22, keyboard 24, and mouse 26 of FIG. 1) may be connected to the input/output interface 130. The display devices 136 and input devices 138 may be used to display a user interface that may include various graphical user interface (GUI) features that are usable to perform inspection operations, and/or to create and/or modify part programs, to view the images captured by the camera system 260, and/or to directly control the vision components portion 200.

In various exemplary implementations, when a user utilizes the machine vision system 100 to create a part program for the workpiece 20, the user generates part program instructions by operating the machine vision system 100 in a learn mode to provide a desired image-acquisition training sequence. For example, a training sequence may comprise positioning a particular workpiece feature of a representative workpiece in the field of view (FOV), setting light levels, focusing or autofocusing, acquiring an image, and providing an inspection training sequence applied to the image (e.g., using an instance of one of the video tools on that workpiece feature). The learn mode operates such that the sequence(s) are captured or recorded and converted to corresponding part program instructions. These instructions, when the part program is executed, will cause the machine vision system to reproduce the trained image acquisition and cause inspection operations to automatically inspect that particular workpiece feature (that is the corresponding feature in the corresponding location) on a run mode workpiece, or workpieces, which matches the representative workpiece used when creating the part program.

These analysis and inspection methods that are used to inspect features in a workpiece image are typically embodied in the various video tools (e.g., video tools 143a, 143n, etc.) included in the video tool portion 143 of the memory 140, as outlined above. Many known video tools, or "tools" for short, are included in commercially available machine vision systems, such as the QUICK VISION® series of vision systems and the associated QVPAK® software, discussed above.

The video tool portion 143 also includes Z-height measurement tools portion 143z, which provides various operations and features related to Z-height measurement operations. In one implementation, the Z-height measurement tools portion 143z may include Z-height tools 143zt (e.g., including an autofocus tool, a multipoint autofocus tool, etc.). The Z-height tools 143zt may govern certain aspects of image stack acquisition and related pattern projection operations and processing in conjunction with the Z-height tools that are configured in a mode that determines best focus heights and/or Z-height measurements. Briefly, the Z-height measurement tools portion 143z may perform at least some operations similarly to known Z-height measurement tools, for example, performing operations in learn mode and run mode for generating all or parts of focus curves, and finding peaks as best focus positions, etc.

In various implementations, the machine vision system 100 of FIG. 2 may incorporate one or more types of focus measurement (e.g., for utilization in automated video inspection or otherwise), such as for controlling continuous autofocus and/or for making surface height measurements, etc. As will be described in more detail below, in various implementations such techniques may be utilized as part of an autofocus process, such as performed by the vision components portion 200. For example, in various implementations the vision components portion 200 may be configured to be utilized to perform an autofocus process which indicates z-heights of a plurality of sampling points on a workpiece surface (e.g., for determining coarse surface profile data for the workpiece surface). In various implementations, such processes may include utilization of an image-based focus measurement technique or a signal-based focus measurement technique. In various implementations, the autofocus process as described herein (e.g., which the vision components portion 200 is configured to be utilized to perform) may also or alternatively be referenced as a focus measurement process.

In general, an image-based focus measurement may be based on analysis of the contrast in acquired images, and for a given field of view, the highest contrast image generally corresponds to the best focused image. A surface height measurement may be inferred from the best focused image position, since the camera-to-workpiece and/or lens-to-workpiece distance corresponding to any image is generally known in machine vision systems. Such techniques for image-based focus measurement (e.g., as may be included in the machine vision system 100) will be described in more detail below with respect to FIGS. 4A and 4B.

In general, a signal-based focus measurement (e.g., in contrast to an image-based focus measurement) may be based on the use of an auxiliary focus sensor that does not rely on the images of the machine vision system for determining the best focus position or surface height. Various types of auxiliary focus sensors are known, including triangulation sensors, knife edge focus sensors, chromatic confocal sensors, Shack-Hartmann type wavefront sensors, etc., as described in U.S. Pat. Nos. 4,336,997; 4,950,878; 6,184, 974; 7,301,133; 7,723,657 and 7,728,961, each of which is hereby incorporated herein by reference in its entirety. Generally, auxiliary focus sensors perform focus measurement by receiving optical signals from a workpiece, converting them to electrical signals, and comparing them with a reference signal corresponding to the best focus (zero) position of a workpiece surface height. Thus, by determining that an obtained electrical signal is above or below the reference signal by how much, it can be determined that an image is out of focus in a positive (+) or a negative (−) direction by how much along the optical (e.g., vertical) axis relative to the best focus (zero) position of the objective lens. In certain implementations, the signal-based focus measurement techniques may generally be faster than the image-based focus measurement techniques and thus well suited for application in a tracking autofocus (TAF) sensor that is configured to continuously and automatically maintain focus in a machine vision system in real time.

Correspondingly, as illustrated in FIG. 2, in some implementations a tracking autofocus (TAF) portion 1000 may be fully or partially included in the vision components portion 200, or may be fully or partially included in the control system portion 120 (see 1000'). The TAF portion 1000 will be described in more detail below with respect to FIG. 3.

Figure 3:
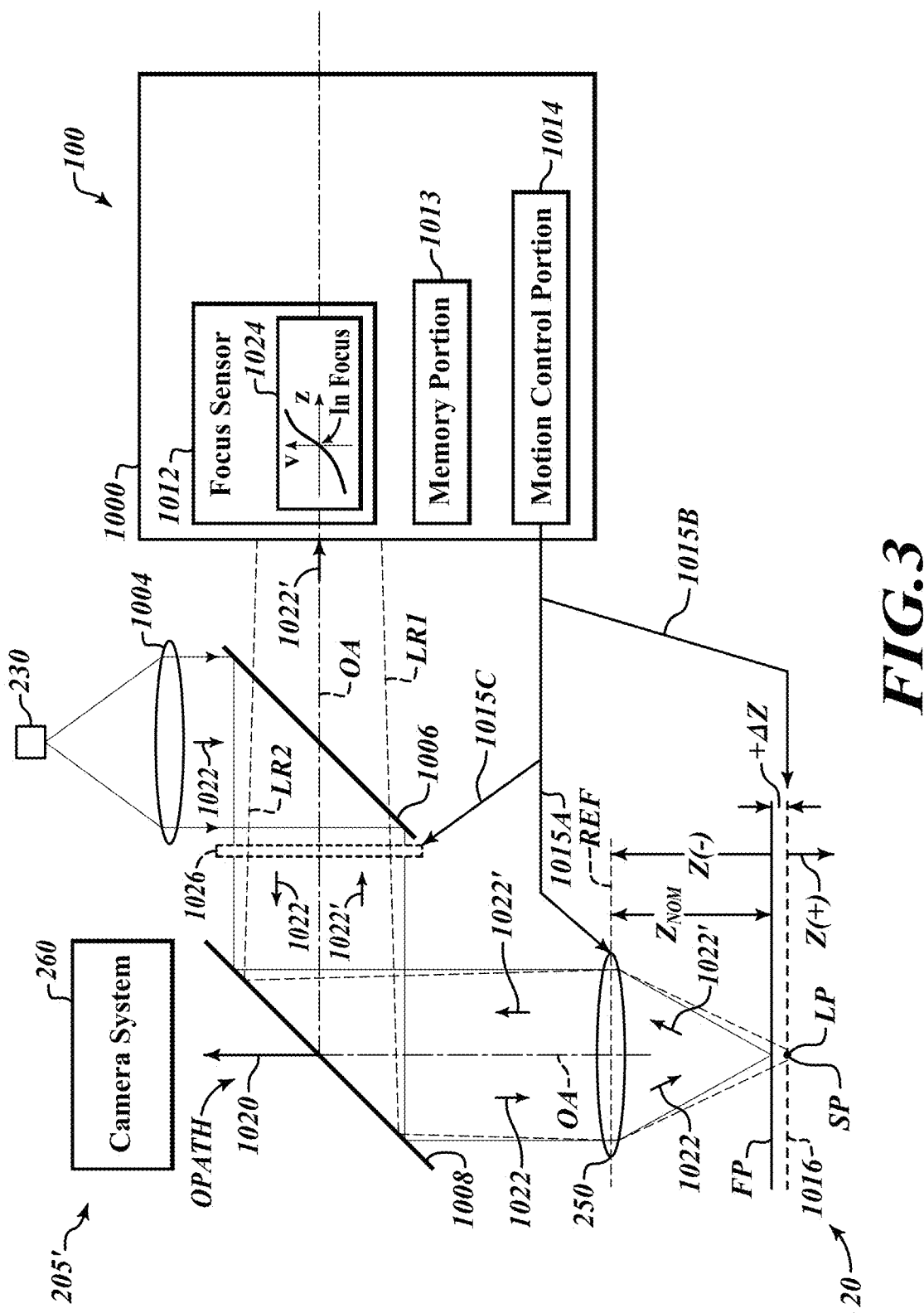
FIG. 3 is a diagram illustrating components and operations of a tracking autofocus (TAF) portion.

FIG. 3 illustrates an example TAF assembly, including a TAF portion 1000, the light source 230, and an optical assembly portion 205', which may be incorporated in the machine vision system of FIG. 2. As will be apparent to those skilled in the art, the optical assembly portion 205' of FIG. 3 is one example of the optical assembly portion 205 described above in reference to FIG. 2, and shares some of the same elements such as the camera system 260 and the objective lens 250, while being specifically configured to suitably incorporate the TAF portion 1000 in the machine vision system 100. The TAF portion 1000 includes a focus sensor 1012 and a motion control portion 1014 that is responsive to a focus signal derived from the focus sensor 1012 to focus the optical assembly portion 205' at the height corresponding to the current surface height 1016 of a workpiece being imaged. The optical assembly portion 205' includes a collimation lens 1004, a first beamsplitting surface 1006, a second beamsplitting surface 1008, the objective lens 250, a nominal focus plane FP of the objective lens 250, and the camera system 260.

The motion control portion 1014 (e.g., as may control the movement mechanism 294Z and/or other movement or adjustment mechanisms) is configured to make automatic adjustments necessary to align the nominal focus plane FP of the objective lens 250 with the workpiece surface 1016, so as to maintain focus for the optical assembly portion 205', based on the focus signal derived from the focus sensor 1012. In FIG. 3, the objective lens 250 provides a workpiece inspection image via image light 1020 transmitted through the second beamsplitting surface 1008 to the camera system 260. The objective lens 250 also provides a reflected beam 1022' to be reflected from the second beamsplitting surface 1008 along the optical axis OA of the TAF portion 1000 toward the focus sensor 1012. In operation, radiation from the light source 230 is input to collimation lens 1004, which outputs an illumination beam 1022 to the first beamsplitting surface 1006, which outputs (and deflects) it to be input to the second beamsplitting surface 1008, which outputs (and deflects) it to the objective lens 250. The objective lens 250 inputs the illumination beam 1022 and focuses it at the nominal focus plane FP along the optical axis OA. The nominal focus plane FP is located at a distance ZNOM from a reference plane REF that is fixed relative to the objective lens 250.

The workpiece surface 1016 may be located along the optical axis OA at a sensed distance ZNOM+ΔZ, as shown in FIG. 3. The workpiece surface 1016 reflects the focused illumination beam 1022 to provide a reflected beam 1022'. The objective lens 250 receives and transmits the reflected beam 1022'. The transmitted reflected beam 1022' is then input to the second beamsplitting surface 1008, which outputs (and deflects) it to the first beamsplitting surface 1006, which outputs it along the optical axis OA to be input to the focus sensor 1012.

The focus sensor 1012 may be based on any of the various auxiliary focus sensor techniques described above, such as the knife edge focus technique, chromatic confocal technique, and Shack-Hartmann type of wavefront sensing technique. The focus sensor 1012 is capable of receiving optical signals (e.g., the transmitted reflected beam 1022') from the object (i.e., the workpiece surface 1016) and converting them to electrical signals (e.g., in voltage V), and comparing them with a reference signal corresponding to the best focus (zero) position or surface height corresponding to the nominal focus plane FP, as shown in a graph 1024 for example. Specifically, when V is determined to be positive or negative, the workpiece surface 1016 generating the reflected beam 1022' is determined to be at a distance +ΔZ away from the objective lens 250, or at a distance −ΔZ closer to the objective lens 250, relative to the nominal focus plane FP. In the example of FIG. 3, the workpiece surface 1016 is illustrated at a position that is separated by +ΔZ from the focus plane FP in the Z positive direction.

In various implementations, based on the focus signal derived from the focus sensor 1012, the motion control portion 1014 may make necessary adjustment to focus the optical assembly portion 205' at the Z height corresponding to the current surface height 1016. To that end, in the illustrated example, the motion control portion 1014 may move the objective lens 250 by +ΔZ in the Z positive direction along the optical axis, may move a workpiece stage (not shown) supporting the workpiece surface 1016 by −ΔZ in the Z negative direction along the optical axis, or may move both the objective lens 250 and the workpiece stage supporting the workpiece surface 1016 so as to align the nominal focus plane FP with the workpiece surface 1016. In this connection, the motion control portion 1014 may control the controllable motor 294Z to actuate the objective lens 250 and/or control a suitable linear actuator and a linear encoder to focus the optical assembly portion 205' at the current surface height 1016.

In yet another example, the optical assembly portion 205' may further include a collimation adjustment element 1026, and the motion control portion 1014 may control the collimation adjustment element 1026, based on the focus signal derived from the focus sensor 1012, to provide an amount of collimation adjustment to the illumination beam 1022 so as to focus the optical assembly portion 205' at the Z height corresponding to the current surface height 1016. The collimation adjustment element 1026 may be a variable focus lens that is electronically adjustable, and may be provided between the first beamsplitting surface 1006 and the second beamsplitting surface 1008.

In various embodiments, the TAF portion 1000 is configured to apply a laser beam point (LP) at a current XY position of the current Z height, so that an operator can visually verify the current XY position that the TAF portion 1000 is tracking. To that end, a suitable laser beam source (not shown) is arranged.

In all of the above examples, a z-height of the workpiece surface (e.g., as determined at a sampling point on the workpiece surface) may be determined and recorded (e.g., as recorded in a memory portion 1013 or otherwise). For example, after the motion control portion 1014 is utilized to make the necessary adjustment to focus the optical assembly portion 205' at the Z height corresponding to the current surface height 1016 (e.g., corresponding to a z-height of a sampling point on the workpiece surface 1016), the z-height of the workpiece surface/sampling point may be recorded (e.g., in the memory portion 1013 or otherwise, to be utilized for determining an inspection scan path for the inspection portion 300, as will be described in more detail below). In various implementations, such determinations and recording of the z-height of the workpiece surface/sampling point may be performed based on the focus signal derived from the focus sensor 1012 (e.g., without requiring further operations for adjusting a focus position etc.). For example, for the configuration of FIG. 3 where the workpiece surface 1016 is illustrated at a position that is separated by +ΔZ from the focus plane FP in the Z positive direction, such is indicated by the focus signal derived from the focus sensor 1012, for which that focus signal may be utilized for determining and recording the corresponding z-height of the workpiece surface/sampling point (e.g., which in some implementations may result in a faster overall process than one that requires physical adjustments at each sampling point). In either case, in various implementations, such z-height data may be determined and recorded for a plurality of sampling points along the workpiece. For example, for performing the auto-focus process at each of the sampling points, the optical assembly portion 205 (e.g., including the TAF portion 1000) may move along a sampling scan path relative to the workpiece surface. In various implementations, the sampling scan path may include the relative movements (i.e., between the optical assembly portion 205 and the workpiece 20) for the moving to and sensing the z-height of each of the sampling points.

As noted above, the TAF portion 1000 may be fully or partially included in the vision components portion 200, or may be fully or partially included in the control system portion 120 (see 1000'). The TAF portion 1000 may be partially included in the vision components portion 200, for example, when only the focus sensor 1012 is included in the vision components portion 200 while the motion control portion 1014 is included in the control system portion 120. As will be apparent to those skilled in the art, various operations regarding the TAF portion 1000 may be implemented by hardware configuration, software configuration, or a combination of hardware and software configuration and, therefore, various hardware and/or software components and features of the TAF portion 1000 may be suitably arranged between the vision components portion 200 and the control system portion 120 of the machine vision system 100, depending on each implementation.

Referring additionally to FIG. 3, signal lines 1015A, 1015B, and/or 1015C (e.g., each for controlling a movement mechanism such as movement mechanism 294Z), may be for controlling a Z height of the objective lens 250, a Z height of the workpiece stage 210, and/or the variable focus of the collimation adjustment element 1026, respectively. The signal lines 1015A, 1015B, and/or 1015C may thus be utilized to focus the optical assembly portion 205' at the current Z surface height 1016 and may also be connected to the input/output interface 130 if the TAF motion control portion 1014 is included in the control system portion 120. In addition, a signal input line into the TAF focus sensor 1012 may be connected to the input/output interface 130 if the focus sensor 1012 is included in the control system portion 120.

In various implementations, the TAF portion 1000 is configured to generate electrical signals (e.g., in voltage V) that are indicative of a current focus status relative to a reference signal corresponding to the best focus (e.g., V=0) position, as schematically shown in the graph 1024 in FIG. 3. V can be converted to a corresponding current Z height such that, for example, when V is determined to be positive or negative, the current Z height at a current XY position is determined to be different by $+\Delta Z$ or $-\Delta Z$ relative to the required TAF focus Z height at the current XY position. A signal/deviation signal portion of the TAF portion 1000 may be configured to generate a surface tracking error signal, such as in voltage V, which includes a difference between the current Z height at a current XY position and an indication of the required TAF focus Z height at the current XY position. Alternatively or additionally, the signal/deviation signal portion may generate a TAF deviation signal, such as in $+\Delta Z$ or $-\Delta Z$, which is indicative of the difference between the current Z height at a current XY position and the required TAF focus Z height at the current XY position. In contrast to such signal-based focus measurement (e.g., such as that of FIG. 3), image-based focus measurement (e.g., as based on analysis of the contrast in acquired images in an image stack) may alternatively be performed in certain configurations, and will be described in more detail below with respect to FIGS. 4A and 4B.

Figure 4A:
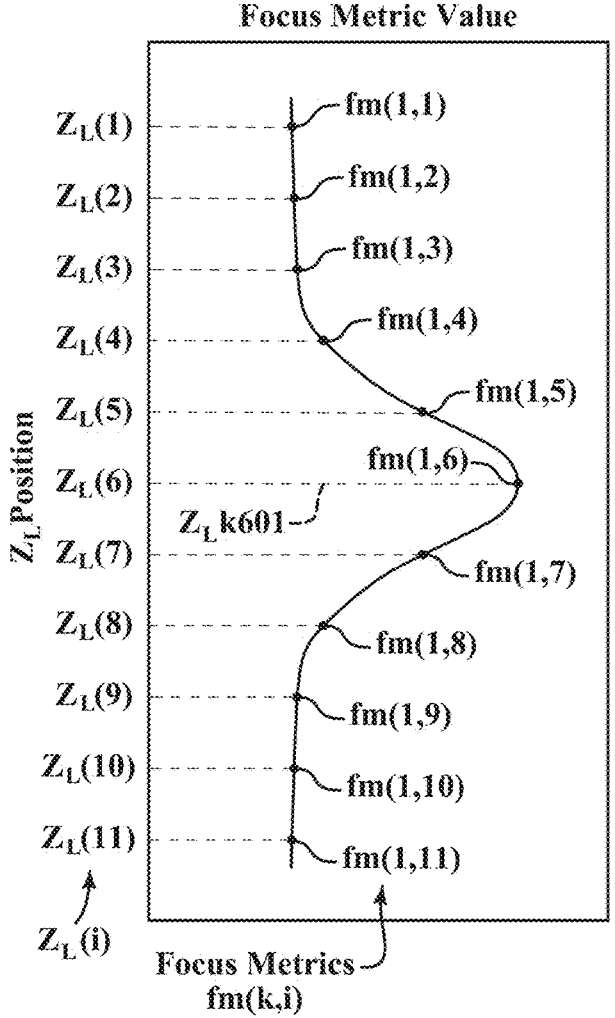
FIGS. 4A and 4B illustrate an image stack and a focus curve, including images at varying focal lengths/distances.
Figure 4B:
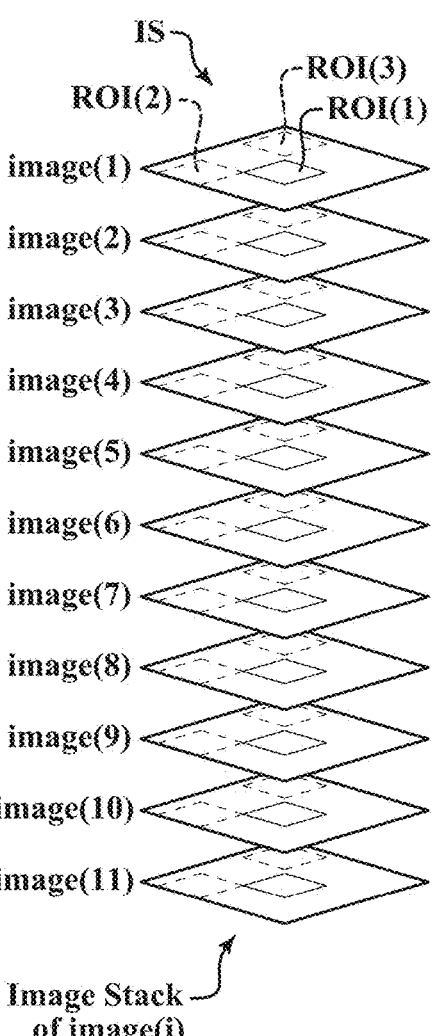

FIGS. 4A and 4B illustrate how an image stack, including images at varying focal lengths/distances, obtained by the optical assembly portion 205 may be utilized to determine an autofocus height (i.e., an autofocus position or $Z_L$ position or $Z_L$ height) of a point (e.g., a sampling point) on a workpiece surface, along a $Z_L$-axis. As used herein, "$Z_L$-axis" may correspond to the Z axis of the of the optical assembly portion 205 (e.g., corresponding to the optical axis OA of the objective lens 250 of the optical assembly portion 205). In various implementations, the image stack IS may be obtained by the optical assembly portion 205 operating in an autofocus mode (e.g., as controlled by an autofocus portion 1000' and/or in relation to operations of an autofocus tool 143af, etc.) to determine an autofocus height (i.e., a $Z_L$-height or $Z_L$-position) of a location (e.g., of a sampling point) of the workpiece surface.

Specifically, FIGS. 4A and 4B illustrate operations associated with determining, for each of one or more points (e.g., sampling points) on a surface of a workpiece, a relative $Z_L$-position (i.e., autofocus height) along an optical axis direction (i.e., coinciding with the $Z_L$-axis of the optical assembly portion 205). As indicated in FIGS. 4A and 4B, a focus position of the optical assembly portion 205 may be moved through a range of positions $Z_L$(i) along a direction of an optical axis and/or an image stack acquisition axis, which may correspond to the focusing axis at each image acquisition position. The optical assembly portion 205 may capture an image(i) at each position $Z_L$(i). For each captured image(i), a focus metric fm(k,i) may be calculated based on a region or sub-region of interest ROI(k) (e.g., a set of pixels) in the image (e.g., with the corresponding surface point at the center of the region or sub-region of interest ROI(k)). The focus metric fm(k,i) is related to the focus position of the optical assembly portion 205 (e.g., in accordance with a distance to the workpiece surface), along the direction of the optical axis at the time that the image(i) was captured. This results in focus curve data (e.g., a set of the focus metrics fm(k,i) at the positions $Z_L$(i), which is one type of focus peak determining data set), which may be referred to simply as a "focus curve" or "autofocus curve". In one embodiment, the focus metric values may involve a calculation of the contrast or sharpness of the region of interest in the image.

The $Z_L$-position (e.g., $Z_L$k601 in FIG. 4A) corresponding to the peak of the focus curve, which corresponds to the best focus position along the z-axis, is the $Z_L$ position for the region of interest used to determine the focus curve. It will be appreciated that while the image stack is shown for purposes of illustration as including eleven images (image (1)-image(11)), in an actual embodiment a smaller or larger number of images may be utilized. In various implementations, the number of images may depend at least in part on the selected scan range of the autofocus process. As one specific numerical example, to perform an autofocus process over a 75 micron scan range, in one implementation the corresponding image stack may include approximately 8-10 images. In addition, in various implementations the images of an image stack may be smaller of larger (e.g., including fewer or more regions of interest of a given size), depending on the implementation (e.g., as may be related to the size of the field of view of the camera and/or other factors).

Figures 12A, 12B:
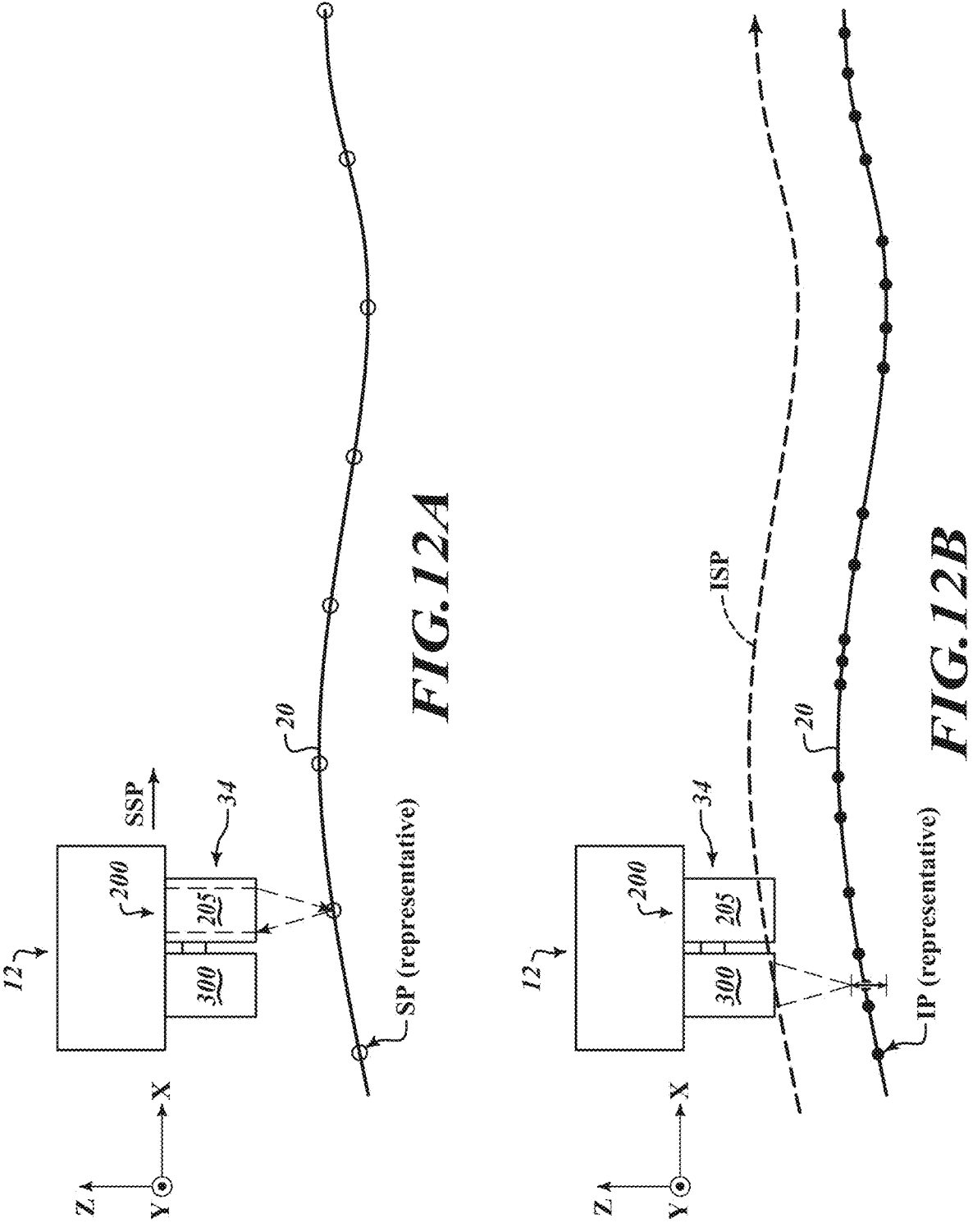
FIG. 12A is a schematic diagram illustrating use of the vision components portion of FIG. 11 to perform an autofocus process which indicates z-heights of a plurality of sampling points SP on a surface of a workpiece for determining coarse surface profile data for the surface of the workpiece, for which a sampling scan path SSP is followed.
FIG. 12B is a schematic diagram illustrating use of the inspection portion of FIG. 11 to perform an inspection process, which includes acquiring an extended depth of field (EDOF) image for each inspection point IP of a plurality of inspection points IP on the surface of the workpiece, and for which an inspection scan path ISP is followed.

As indicated by the autofocus curve generated for images (1)-(11), in the illustrated example, image(6) (i.e., with the corresponding focus metric fm(1,6)) appears to be close to or at the best focus. For example, a feature in the middle of ROI(1) (e.g., at a sampling point such as illustrated in FIG. 12A) would appear to be most in focus in image(6), as compared to in other images where that portion of the workpiece surface would appear to be progressively more out of focus in images further from image(6), and may appear more and more blurred. When a focus metric value is based on contrast as noted above, one method includes comparing a central pixel of an ROI (e.g., corresponding to the sampling point) with its neighboring pixels in the ROI in terms of color/brightness, etc. By finding the image with the highest overall contrast, which corresponds to a focus position of when the image was acquired, an indication/measurement of the relative $Z_L$-position (i.e., autofocus height) of a surface point (e.g., a sampling point at the center of the ROI(1)) can be obtained along the optical axis OA and the image stack acquisition axis.

In FIG. 4B as described above, a central region of interest ROI(1) is deemed to be approximately in focus at image(6), which corresponds to position $Z_L$(6) along the optical axis of the optical assembly portion 205. Thus, the surface point (e.g., sampling point) on the workpiece surface that corresponds to the center of the ROI(1) may be determined to be at the relative position $Z_L$(6), as approximately corresponding to the focus position of ROI(1) in image(6) in the image stack. In some cases, similar processing may be performed for each of other regions of interest (regions of interest ROI(2) and ROI(3)), to determine the relative $Z_L$ positions of the surface points that correspond to the center of the ROI(2) and the ROI(3).

It will be appreciated that a determined peak focus position (i.e., corresponding to an autofocus height) in some instances may fall between two images in an image stack, for which the focus peak position may be determined by interpolation or other techniques in accordance with the fitting of the focus curve to the focus metric values determined for the images.

In various implementations, for a plurality of sampling points, the corresponding image stacks may be processed to determine or output a $Z_L$ height coordinate map (e.g., a point cloud) that quantitatively indicates a set of 3 dimensional surface coordinates (e.g., corresponding to a general surface shape or profile of the workpiece). In various implementations, a relatively sparse pattern of sampling points (e.g., captured with fewer image stacks and corresponding processing) may be acquired and processed relatively quickly, in relation to determining coarse surface profile data for the surface of the workpiece (e.g., and for which z-heights of surface locations between the sampling points may be determined through interpolation, etc.). Thereafter, utilizing the coarse surface profile data to help determine a 3 dimensional inspection scan path (e.g., which includes adjustments to keep a distance between an inspection portion and the workpiece surface within an operational range of the inspection portion), extended depth of field (EDOF) images may be acquired for specified inspection points on the workpiece surface (e.g., for which the EDOF images may provide highly accurate image data in relation to inspecting the workpiece surface at the specified inspection points, and which may be utilized for determining dimensions etc. of corresponding workpiece features, etc.).

Figure 5:
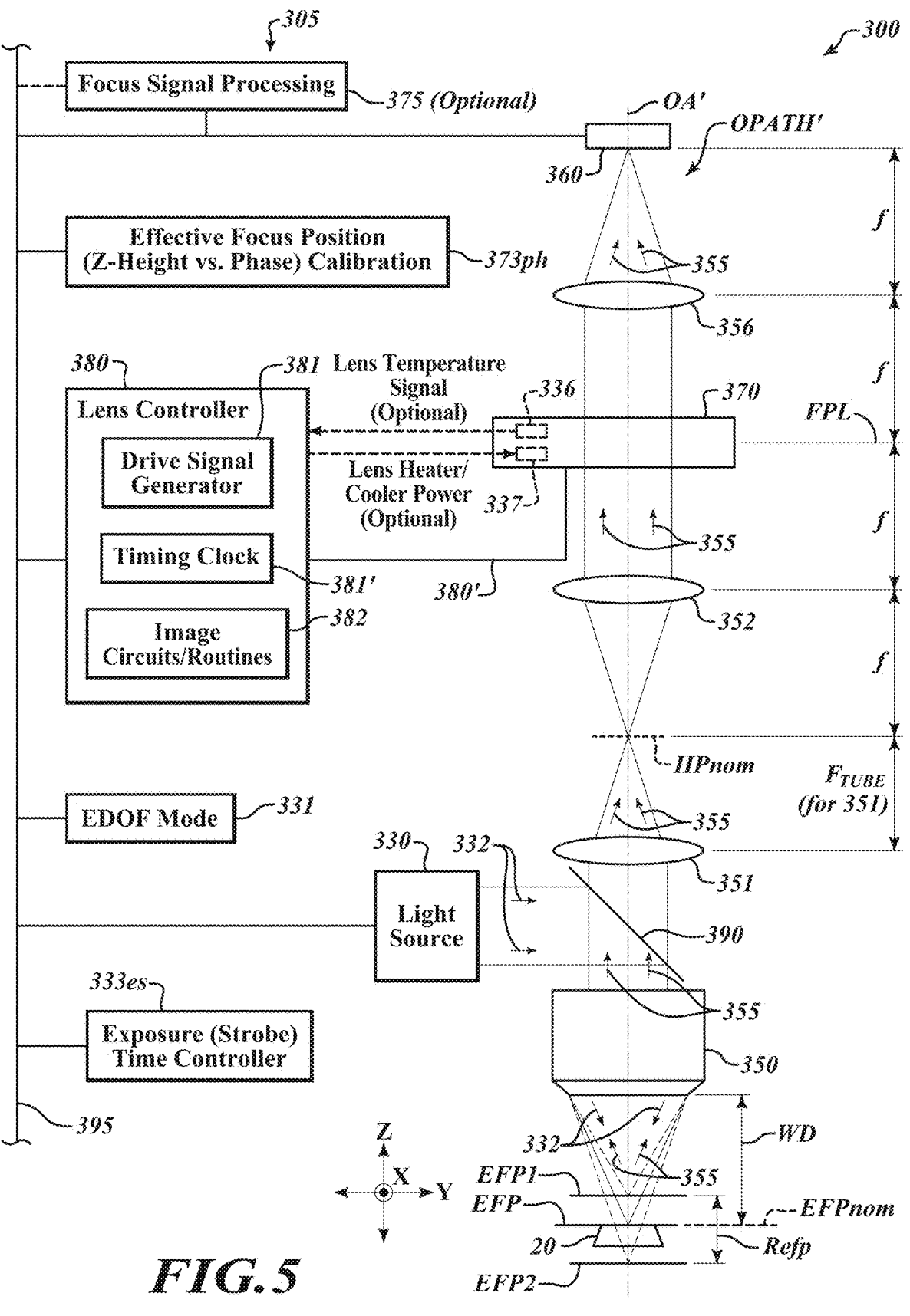
FIG. 5 is a diagram of an inspection portion which includes a variable focal length (VFL) lens.

FIG. 5 is a schematic diagram of an inspection portion 300 (e.g., which in some implementations may also or alternatively be referenced as a VFL lens system 300 or a VFL inspection portion 300) that includes a VFL lens 370. The inspection portion 300 may be operated according to principles described herein. As will be described in more detail below, an imaging optical path OPATH' (also called a workpiece imaging optical path herein) comprises various optical components arranged along a path that conveys image light 355 from the workpiece 20 to the camera 360. The image light is generally conveyed along the direction of their optical axes OA'. In the implementation shown in FIG. 5, all the optical axes OA' are aligned. However, it will be appreciated that this implementation is intended to be exemplary only and not limiting. More generally, the imaging optical path OPATH' may include mirrors and/or other optical elements, and may take any form that is operational for imaging the workpiece 20 using a camera (e.g., the camera 360) according to known principles. In the illustrated implementation, the imaging optical path OPATH' includes the VFL lens 370 (which may be included in a 4f imaging configuration) and is utilized at least in part for imaging a surface of a workpiece 20 during a workpiece image exposure.

As shown in FIG. 5, the inspection portion 300 includes a light source 330, an exposure (strobe) time controller 333es, an objective lens 350, a tube lens 351, a relay lens 352, the VFL lens 370, a relay lens 356, a lens controller 380, a camera 360, an effective focus position (Z-height vs. phase) calibration portion 373ph, and a workpiece focus signal processing portion 375 (optional). In various implementations, the various components may be interconnected by direct connections or one or more data/control busses (e.g., a system signal and control bus 395) and/or application programming interfaces, etc. In various implementations, the components 331, 333es, 373ph, 375 and 380 may be included in a control portion 305.

As will be described in more detail below, in various implementations, the VFL lens controller 380 may control a drive signal of the VFL lens 370 to periodically modulate optical power of the VFL lens 370 over a range of optical powers that occur at respective phase timings within the periodic modulation. The camera 360 (e.g., including an image detector) receives light transmitted along an imaging optical path OPATH' through the VFL lens 370 during an image exposure and provides a corresponding camera image. The objective lens 350 inputs image light arising from a workpiece 20 during an image exposure, and transmits the image light along the imaging optical path OPATH' through the VFL lens 370 to the camera 360 during the image exposure, to provide a workpiece image in a corresponding camera image. An effective focus position EFP in front of the objective lens 350 during an image exposure corresponds to the optical power of the VFL lens 370 during that image exposure. The exposure time controller 333es is configured to control an image exposure timing used for a camera image.

With respect to the general configuration shown in FIG. 5, the light source 330 may be a "coaxial" or other light source configured to emit the source light 332 (e.g., with strobed or continuous illumination) along a path including a beam splitter 390 (e.g., a partially reflecting mirror as part of a beam splitter) and through the objective lens 350 to a surface of a workpiece 20. The objective lens 350 receives the image light 355 (e.g., workpiece light) that is focused at an effective focus position EFP proximate to the workpiece 20, and outputs the image light 355 to the tube lens 351. The tube lens 351 receives the image light 355 and outputs it to the relay lens 352. In other implementations, analogous light sources may illuminate the field of view in a non-coaxial manner; for example, a ring light source may illuminate the field of view.

In various implementations, the objective lens 350 may be an interchangeable objective lens, and the tube lens 351 may be included as part of a turret lens assembly (e.g., similar to the interchangeable objective lens 250 and the turret lens assembly 223 of FIG. 2). In the implementation shown in FIG. 5, image light 355 arising from a nominal focal plane of the objective lens 350 is focused by the tube lens 351 to form an intermediate image at a nominal intermediate image plane IIPnom. When the VFL lens 370 is in a state where it provides no lensing effect (no optical power), the nominal focal plane of the objective lens 350, the nominal intermediate image plane IIPnom, and the image plane of the camera 360 form a set of conjugate planes, according to known microscope imaging principles. In various implementations, any of the other lenses referenced herein may be formed from or operate in conjunction with individual lenses, compound lenses, etc.

The relay lens 352 receives the image light 355 from the tube lens 351 (or more generally from an intermediate image plane, in various alternative microscope configurations) and outputs it to the VFL lens 370. The VFL lens 370 receives the image light 355 and outputs it to the relay lens 356. The relay lens 356 receives the image light 355 and outputs it to the camera 360. In various implementations, the camera 360 captures a camera image during an image exposure (e.g., during an integration period of the camera 360) also referred to as an image exposure period, and may provide the corresponding image data to a control system portion. Some camera images may include a workpiece image (e.g., of a region of the workpiece 20) provided during a workpiece image exposure. In some implementations, an image exposure (e.g., a workpiece image exposure) may be limited or controlled by a strobe timing of the light source 330 that falls within an image integration period of the camera 360. In various implementations, the camera 360 may have a pixel array greater than 1 megapixel (e.g., 1.3 megapixel, with a 1280×1024 pixel array, with 5.3 microns per pixel).

In the example of FIG. 5, the relay lenses 352 and 356 and the VFL lens 370 are designated as being included in a 4f optical configuration, while the relay lens 352 and the tube lens 351 are designated as being included in a Keplerian telescope configuration, and the tube lens 351 and the objective lens 350 are designated as being included in a microscope configuration. All of the illustrated configurations will be understood to be exemplary only, and not limiting with respect to the present disclosure. In various implementations, the illustrated 4f optical configuration permits placing the VFL lens 370 (e.g., which may be a low numerical aperture (NA) device) at the Fourier plane of the objective lens 350. This configuration may maintain the telecentricity at the workpiece 20, and may minimize scale change and image distortion (e.g., including providing constant magnification for each effective focus position (Z-height) of the workpiece 20). The Keplerian telescope configuration (e.g., including the tube lens 351 and the relay lens 352) may be included between the microscope configuration and the 4f optical configuration, and may be configured to provide a desired size of the projection of the objective lens clear aperture at the location of the VFL lens 370, so as to minimize image aberrations, etc.

In various implementations, the lens controller 380 may include a drive signal generator portion 381, a timing clock 381', and imaging circuits/routines 382. The drive signal generator portion 381 may operate (e.g., in conjunction with the timing clock 381') to provide a periodic drive signal to the high speed VFL lens 370 via a signal line 380' (e.g., for providing and/or adjusting an amplitude driving signal, as will be described in more detail below). In various implementations, the inspection portion 300 may comprise a control system (e.g., including the components of the control portion 305, and as may be coupled to and/or include certain components similar to those of the control system portion 120 of FIG. 2) that is configurable to operate in conjunction with the lens controller 380 for coordinated operations.

In various implementations, the lens controller 380 may generally perform various functions related to imaging a workpiece 20 in a manner synchronized with a desired phase timing of the VFL lens 370, as well as controlling, monitoring and adjusting the driving and response of the VFL lens 370. In various implementations, the image circuits/routines 382 perform imaging operations for the inspection portion 300, synchronized with the phase timings of the VFL lens 370.

In various instances, drift in the operating characteristics of the VFL lens may arise due to unwanted temperature variations. As shown in FIG. 5, in various implementations, the inspection portion 300 may optionally include the lens heater/cooler 337 associated with the VFL lens 370. The lens heater/cooler 337 may be configured to input an amount of heat energy into the VFL lens 370 and/or perform cooling functions to facilitate heating and/or cooling of the VFL lens 370 according to some implementations and/or operating conditions. In addition, in various implementations, a VFL lens monitoring signal may be provided by a temperature sensor 336 associated with the VFL lens 370 to monitor an operating temperature of the VFL lens 370.

With respect to the general operations of the VFL lens 370, in various implementations as described above, the lens controller 380 may rapidly adjust or modulate its optical power periodically, to achieve a high-speed VFL lens that periodically modulates its optical power at a VFL lens resonant frequency of 400 kHz, 250 kHz, 70 KHz, or 30 kHz, etc., i.e., at a high speed. As shown in FIG. 5, by using the periodic modulation of a signal to drive the VFL lens

370, the effective focus position EFP of the inspection portion 300 (that is, the focus position in front of the objective lens 350) may be rapidly moved within a range Refp (e.g., a focus range, etc.) bound by an effective focus position EFP1 (or EFPmax or peak focus distance Z1max+) corresponding to a maximum optical power of the VFL lens 370 in combination with the objective lens 350, and an effective focus position EFP2 (or EFPmin or peak focus distance Z1max−) corresponding to a maximum negative optical power of the VFL lens 370 in combination with the objective lens 350. In various implementations, the effective focus positions EFP1 and EFP2 may approximately correspond to specified phase timings that are separated by 180 degrees (e.g., phase timings of 90 degrees and 270 degrees). For purposes of discussion, the middle of the range Refp may be designated as EFPnom, and may approximately correspond to zero optical power of the VFL lens 370 in combination with the nominal optical power of the objective lens 350. According to this description, EFPnom may approximately correspond to the nominal focal length of the objective lens 350 in some implementations (e.g., which may correspond to a working distance WD of the objective lens 350).

In some implementations, the optional focus signal processing portion 375 may input data from the camera 360 and may provide data or signals that are utilized to determine when an imaged surface region (e.g., of a workpiece 20) is at an effective focus position. For example, a group of images acquired by the camera 360 at different effective focus positions (Z-heights), such as part of an image stack, may be analyzed using a known "maximum contrast" or "best focus image" analysis to determine when an imaged surface region of a workpiece 20 is at a corresponding effective focus position (Z-height). However, more generally, any other suitable known image focus detection configuration may be used. In any case, the workpiece focus signal processing portion 375 or the like may input an image or images acquired during the periodic modulation of the effective focus position (during the sweeping of multiple effective focus positions) of the VFL lens 370, and determine an image and/or image timing at which a target feature (e.g., of a workpiece) is best focused.

In some implementations, the focus signal processing portion 375 may determine a phase timing (or an amplitude driving signal with an associated peak focus distance timing) corresponding to a best focus (e.g., of a workpiece feature) and output that "best focus" phase timing value (or the "best focus" amplitude driving signal having the "best focus" peak focus distance timing) to an effective focus position calibration portion 373*ph*.

The effective focus position (Z-height vs. phase) calibration portion 373*ph* may store "phase" calibration data determined by calibration processes. The effective focus position calibration portion 373*ph* may provide effective focus position (Z-height vs. phase) calibration data that relates respective effective focus positions (Z-heights) to respective "best focus" phase timings within a period of a resonant frequency of the VFL lens 370.

Generally speaking, the effective focus position calibration portion 373*ph* comprises recorded effective focus position (Z-height) calibration data. In various implementations, the associated recorded effective focus position (Z-height) calibration data 373*ph* may be merged with and/or indistinguishable from the lens controller 380, the workpiece focus signal processing portion 375, or a host computer system connected to the system signal and control bus 395, etc. In various implementations, the exposure (strobe) time controller 333es controls an image exposure time of the inspection portion 300 (e.g., relative to a phase timing of the periodically modulated effective focus position). More specifically, during an image exposure, the exposure (strobe) time controller 333es may use the effective focus position (Z-height) calibration data available in the effective focus position (Z-height vs. phase) calibration portion 373ph and control the light source 330 to strobe at a respective time.

For example, the exposure (strobe) time controller 333es may control the strobe light source to strobe at one or more respective phase timings within a period of a standard imaging resonant frequency of the VFL lens 370, so as to acquire an image having image data corresponding to one or more particular effective focus positions within the sweeping (periodic modulation) range of the VFL lens 370. In other implementations, the exposure time controller 333es may control a fast electronic camera shutter of the camera 360 to acquire an image at having image data corresponding to one or more respective controlled times and/or associated effective focus position(s). In some implementations, the exposure (strobe) time controller 333es may be merged with or indistinguishable from the camera 360. It will be appreciated that the operations of the exposure time controller 333es and other features and elements outlined above may be implemented to govern workpiece image acquisitions.

The inspection portion 300 includes an extended depth of field (EDOF) mode 331, which is configured to collect at least one image of a workpiece with a depth of field that is greater than what may be provided by the vision components portion 200 when focused at a single focus position. The operations and components associated with an extended depth of field mode are described further below with reference to FIGS. 6-9B.

The embodiment of an EDOF mode 331 shown in FIG. 5 is usable to perform computational deconvolution of a preliminary image from the inspection portion 300 and provide a relatively clear EDOF image. For example, the inspection portion 300 is configured to collect a first preliminary image during the course of at least one sweep of the modulated focus position throughout an EDOF focus range during the image exposure, and process the first preliminary image, which may be blurry, to determine a relatively clear image. In one embodiment, the preliminary image may be processed or deconvolved using a known or predetermined point spread function (PSF) corresponding to the focus range of the preliminary image. A point spread function P(FP) characterizes a blur circle, i.e., a circular image of a point light source at a given distance from an imaging system as a function of a radius r of the blur circle and the focus position FP. A point spread function may be determined experimentally for an imaging system (e.g., the inspection portion 300) or it may be estimated using point spread functions modeled on functions such as a pill box or a Gaussian curve, or using basic diffraction principles, e.g., Fourier optics, according to known methods. Such point spread functions at various focus distances within a focus range may be weighted according to their expected exposure contributions or applicability. For example, when the focus distance moves during an exposure, each focus distance will contribute to an image exposure for a corresponding time period within that exposure, and a point spread function corresponding to that distance may be weighted accordingly. Such weighted point spread function contributions may be summed or integrated over an expected focus range R. Alternatively, when the focus distance change is a known function of time, such point spread function contributions may be integrated over a period of time corresponding to a sweep of the expected focus range R, analogous to the approach indicated with reference to EQUATION 3 below.

For an imaging system with a modulated focus position, an integrated point spread function h which follows the relation:

$$h = \int_0^T P(FP(t))dt \qquad \text{Eq. 1}$$

where $P(FP(t))$ is a point spread function and $FP(t)$ is the time-dependent focal position. A focus position of an imaging system of a machine vision system may be modulated as a function of time t, over a total integration time T, corresponding to an image exposure or integration time of the first preliminary image.

Deconvolution of the first preliminary image may be understood as an inverse operation that deconvolves a high depth of field image exposed over a range of focus positions having respective durations in the exposure, from an integrated point spread function h, which in some applications may be referred to as a "blur function." The first preliminary image may be represented as a two-dimensional function $g(x,y)$ which is a convolution of an extended depth of field image $f(x,y)$ (corresponding to an image array with dimensions m×n) with the integrated point spread function h by the equation:

$$g(x, y) = f * h = \sum_m \sum_n f(m, n)h(x - m, y - n) \qquad \text{Eq. 2}$$

In the frequency domain, this convolution may be represented by the product of the Fourier transforms of f and h, represented as F and H:

$$G = F \cdot H \qquad \text{Eq. 3}$$

The Fourier transforms of f and h may be determined efficiently using a fast Fourier transform (FFT) algorithm. The EDOF image (in the frequency domain) may be determined by processing the image G (i.e., multiplying it) by an inverse of H denoted here as $H_r$. The inverse $H_r$ may be computed by several known methods. For example, a simple pseudo inverse of H may be determined by the equation:

$$H_r = \frac{H^*}{|H|^2 + k} \qquad \text{Eq. 4}$$

where $H^*$ is the complex conjugate of the H, and k is a real number chosen empirically based on characteristics of the inspection portion 300. In one exemplary embodiment, k is 0.0001. Finally, the extended depth of field image f may be computed as:

$$f(x, y) = g * h_r = \mathcal{F}^{-1}(G \cdot H_r) = \mathcal{F}^{-1}\left\{ G \cdot \frac{H^*}{|H|^2 + k} \right\} \qquad \text{Eq. 5}$$

A more robust alternative to the pseudo inverse may be computed according to a Wiener Deconvolution or a Lucy-Richardson iterative algorithm, which are described in *Digital Image Processing* by Kenneth R. Castleman (Prentice- Hall, Inc., 1996), which is hereby incorporated herein by reference in its entirety. Additionally, processing the image may comprise block-based denoising.

In a different embodiment, a deconvolution may be performed optically using a passive optical filter placed in a Fourier plane of an EDOF imaging system according to basic methods of Fourier optics, in order to provide a relatively clear EDOF image in real time.

In exemplary embodiments, the inspection portion 300 may provide a first preliminary image, which is a blurred image including information acquired throughout a desired focus range during its exposure. The first preliminary image may then be computationally processed as outlined above to provide an extended depth of field image that comprises a depth of field that is larger than the inspection portion 300 may provide at a single focal position (e.g., can be up to 10 times, or up to 100 times larger in some implementations). As a specific numerical example, if at a single focal position the depth of field may be 90 um, an extended depth of field image provided using the same embodiment of the inspection portion 300 may be as large as 9 mm.

Figure 6:
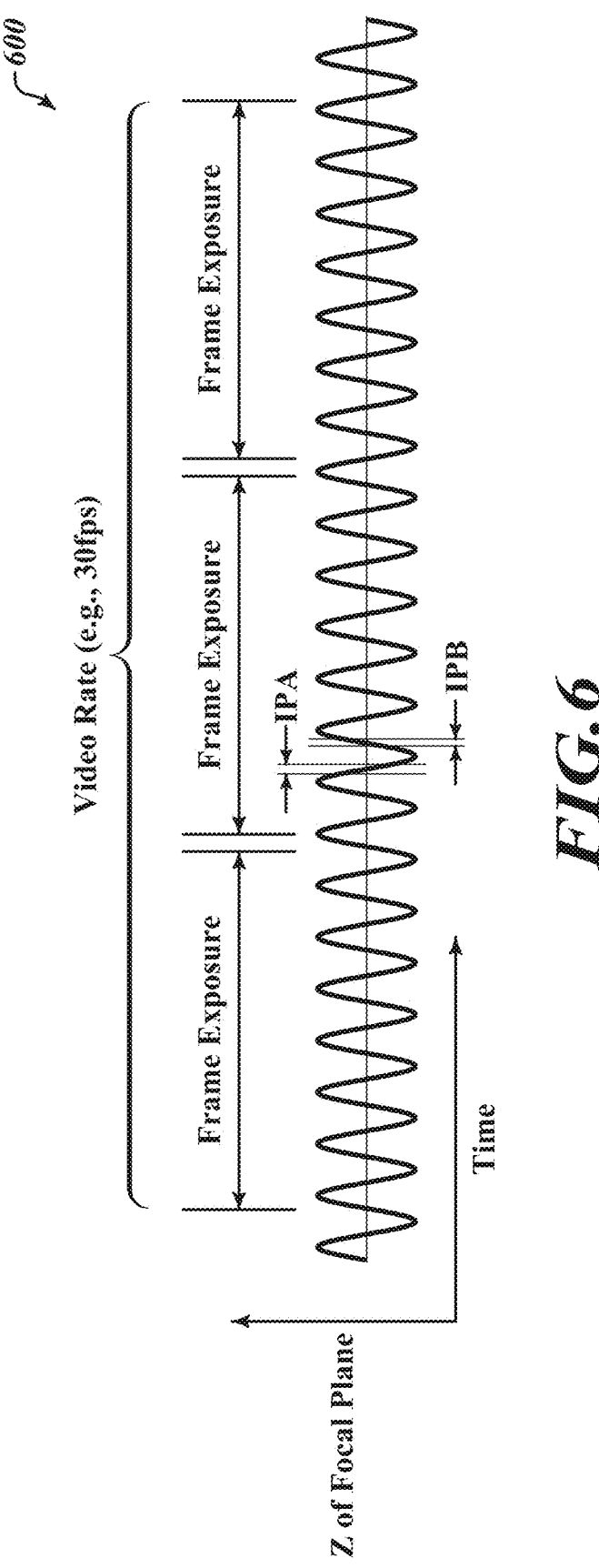
FIG. 6 shows a timing diagram illustrating focal height variation during an image exposure.

FIG. 6 shows an exemplary timing diagram 600 for a focal height during an image exposure as may be used in one embodiment of an EDOF imaging system (e.g., the inspection portion 300). The timing diagram 600 additionally shows exposure times of a camera of the imaging system. Generally speaking, EDOF image exposures, also referred to as frame exposures in the following description, may be performed by the imaging system over at least one sweep of the modulation of the focal height of the imaging system over a desired focus range during the exposure. In the particular example shown in the timing diagram 600, a frame exposure is performed corresponding to at least one cycle of a periodic modulation of the focal height of the imaging system over a desired focus range. High-speed periodic modulation is conveniently performed using the VFL lens 370 (e.g., a tunable acoustic gradient index of refraction (TAG) lens). More specifically, in one embodiment, the following steps reflected in FIG. 6 are repeated at least one time to provide an EDOF image that is substantially focused throughout a larger depth of field than the imaging system provides at a single focal position:

periodically modulating a focus position (focal plane) of the imaging system over a plurality of focus positions along a focus axis direction without macroscopically adjusting the spacing between elements in the imaging system, the focus position periodically modulated in a focus range including a surface height of the workpiece (e.g., at a frequency of at least 300 Hz);

exposing a first preliminary image during an image integration time while modulating the focus position in the focus range; and processing the first preliminary image to remove blurred image contributions occurring during the image integration time to provide an EDOF image that is substantially focused throughout a larger depth of field than the imaging system provides at a single focal position.

It will be understood that in the description immediately above, when the blurred image contributions are computationally removed, the first preliminary image may be a blurred image that initially includes the blurred image contributions. The first preliminary image in this case comprises detected and/or recorded image data. Processing the first preliminary image to remove the blurred image contributions comprises computational processing to the first preliminary image data, to provide an EDOF image (a second or modified image) that is substantially focused throughout a larger depth of field than the imaging system provides at a single focal position. Thus, the first preliminary image and the provided EDOF image comprise different images and/or image data in this embodiment.

In contrast, when the blurred image contributions are removed using an optical filter and passive Fourier image-processing methods, the first preliminary image and the EDOF image occur simultaneously, and the first preliminary image need not be a detected or recorded image. Processing the first preliminary image to remove the blurred image contributions comprises passive optical processing to the first preliminary image light that is input to the EDOF imaging system, to provide an EDOF image at the output or detector of the EDOF imaging system that is substantially focused throughout a larger depth of field than the imaging system provides at a single focal position. Thus, it may be considered in such an embodiment that the first preliminary image is optically processed during its passage through the EDOF imaging system and prior to detection at the camera or detector of the EDOF imaging system, such that the provided EDOF image is the only detected or recorded image in such an embodiment.

In some embodiments it is possible to make an adjustment to a control signal component related to the nominal center of the range R of the periodic modulation in response to a user input (e.g., using a user interface feature of the EDOF mode 331), such that the periodic modulation takes place about a desired nominal center of the range. In some embodiments, such an adjustment may even be controlled to vary automatically during an image exposure, to further extend a focus range beyond that achieved by a single periodic modulation, for example.

It should be appreciated that while the timing diagram shows 7 periods of the modulation of the focal height for each frame exposure, for purposes of illustration, in various embodiments, an inspection portion 300 configured according to the principles disclosed herein may comprise an imaging system that modulates the focal height over a much greater number of periods per frame exposure. For example, an exemplary imaging system may collect video images at 60 frames per second and may modulate the focus height at a rate of 70 kHz, which therefore provides 1,000 periods of focus height modulation per frame exposure. One advantage of such a configuration is that the timing relationship between the frame exposure in the periodic modulation is not critical. For example, Equation 1 shows that an integrated point spread function used to remove blurred image contributions depends on the focal position as a function of time throughout an image exposure. If the assumed integrated point spread function does not match the actual focal position as a function of time throughout the image exposure, then the blurred image contributions will not be treated in an ideal manner. If the assumed integrated point spread function is based on a full periodic modulation of the focus throughout the focus range, and only a single period (or a few periods) of a periodic focus modulation is used during an image exposure then, if the exposure is terminated after a non-integer number of periods, the actual integrated actual focal position may be significantly "unbalanced," in comparison to the assumed integrated point spread function. In contrast, if the accumulated number of periods is significant, e.g., at least 5 periods or preferably many more, during an image exposure, then, if the exposure is terminated after a non-integer number of periods, the unbalanced contribution of the incomplete period may be relatively insignificant, and the assumed integrated point spread function will operate in a nearly ideal manner.

In some embodiments, collecting a first image during the course of at least one period of the periodically modulated focus position may comprise exposing an image during the course of an integer number of periods. Based on the foregoing discussion, it will be understood that this may be particularly valuable when an EDOF image exposure comprises relatively few periods of a periodic focus modulation (e.g., 5 or fewer periods). For example, this might occur when an exposure time must be relatively short in order to avoid overexposure, and/or freeze motion, or the like.

In the example shown in the timing diagram 600, the focus position is modulated sinusoidally. In some embodiments, the image integration time includes a focus change over the entirety of the desired focus range (e.g., at least one period of the periodically modulated focus position, as shown in FIG. 6). In some embodiments, it may be desirable to expose an image only during the more linear portions of the sinusoidal modulation. This allows for more balanced exposure times for each height within the focus position modulation (e.g., the relatively longer focus position dwell times at the extremes of a sinusoidal focus modulation may be eliminated). Thus, in some embodiments, exposing an image during an image integration time comprises providing illumination having an intensity variation (e.g., an on/off cycle or a more gradual intensity variation) synchronized with the periodically modulated focus position, such that it differently influences the respective exposure contributions for different respective focus positions within the range of the periodically modulated focus position. It will be appreciated that a frame exposure may receive substantially no image contribution when the strobe illumination is off. The timing diagram 600 indicates two exemplary integration periods IPA and IPB, which may be used for exposing an image. The exemplary integration periods IPA and IPB exclude the regions near the extrema of the sinusoidal modulation, i.e., both are at least 15 percent of the period length away from extrema portions of the sinusoidal modulation. The integration periods IPA and IPB may be controlled by providing a corresponding strobe illumination during a frame exposure, according to known methods.

FIG. 7 is a flow diagram 700 showing one embodiment of a routine 700 for operating an inspection portion to perform computational deconvolution of a preliminary image from an EDOF imaging system and provide a relatively clear EDOF image approximately in real time.

At a block 710, a focus position of the inspection portion is periodically modulated over a plurality of focus positions along a focus axis direction without macroscopically adjusting the spacing between elements in the imaging system. The focus position is periodically modulated in a focus range including a surface height of the workpiece (e.g., at a frequency of at least 300 Hz, or a much higher frequency, in some embodiments). At a block 720, a first preliminary image is exposed during an image integration time while modulating the focus position in the focus range. In various implementations, the first preliminary image may be considered a type of EDOF image which includes in and out of focus images and/or image data. At a block 730, data from the first preliminary image is processed to remove blurred image contributions occurring in the focus range during the image integration time (e.g., to provide an image that is substantially focused throughout a larger depth of field than the imaging system provides at a single focal position). In various implementations, this may also be characterized extracting an in focus image from a blurred image.

It may be thought that when using a very high speed periodically modulated VFL lens, such as a TAG lens, that the focus position changes so quickly that the only way it may be used to acquire an EDOF image is to continuously expose the EDOF image in the focus range of the high speed variable focus lens, for example, as in some examples outlined above. However this method of EDOF image exposure has certain disadvantages in various implementations. For example, one drawback with the method when using a periodically modulated variable focus lens, is that the focus position changes sinusoidally, and not at a constant rate. This means a continuous (including partially continuous) EDOF image exposure is not uniform throughout the focus range, which is detrimental in a number of implementations. An alternative method of acquiring an EDOF image using such a VFL lens, which may be more desirable in certain implementations, is described below. The alternative method includes using a plurality of discrete image exposure increments to acquire a preliminary EDOF image in a focus range, according to principles described below. Such a method may be a more adaptable, accurate, and/or robust method in various implementations. It should be appreciated that the focus position may change so quickly when using a very high speed periodically modulated VFL lens (e.g., a TAG lens), that significant timing, control, and "exposure amount" problems may arise in practical systems. In order to provide a practical solution to such problems, the discrete image exposure increments that are used as constituents of an EDOF image exposure are acquired over a plurality of periodic focus modulations, according to principles disclosed below.

FIGS. 8A, 8B, 9A and 9B show exemplary timing diagrams 800A, 800B, 900A and 900B, respectively, illustrating various aspects of different image exposure implementations suitable for an EDOF imaging system (e.g., the inspection portion 300). The timing diagrams 800A, 800B, 900A and 900B are somewhat analogous to the timing diagram 600, in that an EDOF image exposure may be acquired during a periodic modulation of the focal height or focal position of an inspection portion over its focus range. However, in contrast with the implementation illustrated in the timing diagram 600, which may use a continuous image exposure, in the implementations shown in timing diagrams 800A, 800B, 900A and 900B, an EDOF imaging system is configured to expose a preliminary image using an image exposure comprising a plurality of discrete image exposure increments, according to principles described below.

Figure 8A:
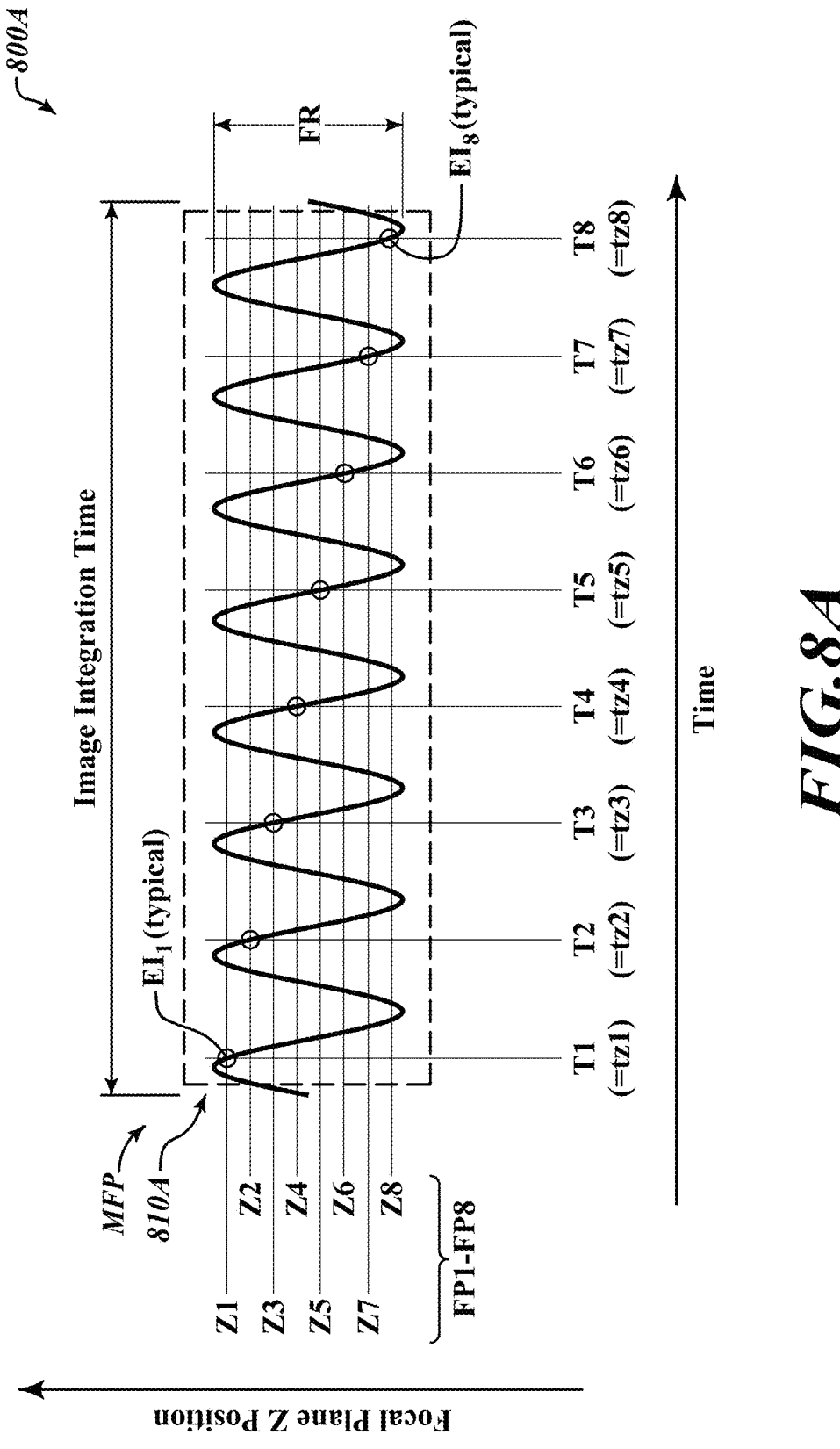
FIGS. 8A and 8B are timing diagrams illustrating aspects of image exposure implementations over an image integration time suitable for obtaining an EDOF image.

In particular, the timing diagram 800A of FIG. 8A shows the periodically modulated focus position MFP of a variable focus imaging system, which is periodically modulated (as shown along the time axis) over a plurality of focus positions along a focus axis direction (as shown along the focal plane Z position axis), over a focus range FR which is assumed to include the distance(s) to the surface of a workpiece to be imaged by the variable focus imaging system. The variable focus imaging system is capable of being operated at a very high focus modulation frequency (e.g., at least 3 kHz, or 30 kHz, or more, in various implementations). As shown in the diagram 800A, a preliminary image is exposed using an image exposure comprising a plurality of discrete image exposure increments EI acquired at respective focus positions FP (e.g., a respective one of the focus positions Z1-Z8) during a camera image integration time comprising a plurality of periods of the periodically modulated focus position MFP. The reference abbreviations EI and/or FP (and/or CT, for controlled timing, used below and shown in FIG. 8B) may include an index numeral "i", which designates a particular "ith" exposure increment EI, or focus position FP, or controlled timing CT. In the case of the exposure increment EI, the index numeral "i" generally ranges from 1 to up to the number of discrete image exposure increments included in the preliminary image exposure (e.g., $EI_1$-$EI_8$, in the example illustrated in FIG. 8A.)

The plurality of discrete image exposure increments EI are each determined by a respective instance of an illumination source strobe operation or a camera shutter strobe operation, that has a respective controlled timing that defines the discrete focus position FP of the corresponding discrete image exposure increment EI. It will be appreciated that a variable focus imaging system having a periodically modulated focus position has a particular focus position at a particular timing or phase within each period of the modulation. The instantaneous phase of the periodic modulation may be known based on either the drive signal of the variable focus lens, or by monitoring the focus position directly, or the like. Therefore, knowing a calibration relationship (e.g., as stored in a calibration portion 373$ph$) between the focus position and the phase of the periodic modulation, a strobe element (e.g., strobe illumination source 330, or a fast electronic camera shutter such as of camera 360) can be controlled to briefly enable an exposure at a particular phase timing in order to acquire an exposure increment at a desired corresponding focus position. This principle may be understood in greater detail with reference to U.S. Pat. Nos. 8,194,307 and 9,143,674, for example, which are hereby incorporated herein by reference in their entirety.

As shown in FIG. 800A, the respective controlled timings (e.g., as represented by their respective increment times T1-T8) are distributed over a plurality of periods of the periodically modulated focus position MFP, and are configured to provide a set of discrete focus positions FP, which are approximately evenly spaced along the focus axis direction (as represented by their focus position values Z1-Z8). It has been determined that evenly spaced and/or "weighted" exposure contributions to a "raw" or preliminary EDOF image may be advantageous in terms of signal processing and/or computational operations that may be subsequently performed to enhance the EDOF image. For example, such exposure contributions may be advantageous when providing an enhanced EDOF image by performing deconvolution operations on the preliminary EDOF image, by using a blur kernel that characterizes variable focus imaging system throughout its focus range. Such deconvolution operations are described, for example, in Publication No. WO2009120718A1, which is hereby incorporated herein by reference in its entirety. However, certain methods of providing evenly spaced and/or weighted exposure contributions throughout a focus range for an EDOF image are not sufficiently fast, accurate (in terms of EDOF image clarity and quality), or repeatable.

As previously outlined, the focus position may change so quickly when using a very high speed periodically modulated variable focus lens (e.g., a TAG lens), that significant timing, control, and "exposure amount" problems may arise in practical systems. In particular, during any particular modulation the imaging system focus position may sequentially pass through adjacent pairs of desired focus positions within a period of tens of nanoseconds, rendering discrete exposures at such sequential adjacent focus positions, impractical and/or inaccurate. In order to provide a practical solution to such problems, the respective controlled timings used to acquire the discrete image exposure increments EI at the desired evenly spaced focus positions FP (e.g., Z1-Z8) are configured such as illustrated in FIG. 8A.

In the diagram 800A of FIG. 8A, the plurality of discrete image exposure increments $EI_1$-$EI_8$ are each determined by a respective instance of an illumination source strobe operation (e.g., of the light source 330, such as with short strobe pulses within a range of 5 ns to 100 ns) or a camera shutter strobe operation that has a respective controlled timing that defines its discrete focus position FP (e.g., one of the evenly spaced focus positions Z1-Z8). The respective controlled timings (e.g., as represented by their respective increment times T1-T8) are distributed over a plurality of periods of the periodically modulated focus position MFP, within the image integration time.

To clarify the operation with respect to diagram 800A, during the periodically modulated focus position MFP, the camera image integration time starts in the discrete image exposure increment $EI_1$ that is acquired at the increment time T1, which has a phase timing tz1 that corresponds to the desired focus position FP=Z1. The periodically modulated focus position MFP then continues through two reversals of the direction of the focus position change during its periodic modulation following the increment time T1. Even when the periodic modulation has a very high frequency, it is then practical to obtain a discrete image exposure increment $EI_2$ at the time T2, which has a phase timing tz2 that corresponds to the desired focus position FP=Z2, which is adjacent to Z1. The acquisition of discrete image exposure increments EI continues in an analogous fashion through the acquisition of the discrete image exposure increment EI8, acquired at the increment time T8, which has a phase timing tz8 that corresponds to the desired focus position FP=Z8. At this point, discrete image exposure increments $EI_1$-$EI_8$ have been acquired at each of the desired evenly spaced focus positions Z1-Z8 (forming 810A), during the image integration time. In this example, the image integration time is terminated at this point. It will be appreciated that this maintains even "image weighting" for each of the focus positions Z1-Z8 in the overall preliminary EDOF image exposure, which comprises the set 810A of discrete image exposure increments and/or evenly spaced focus positions.

Figure 8B:
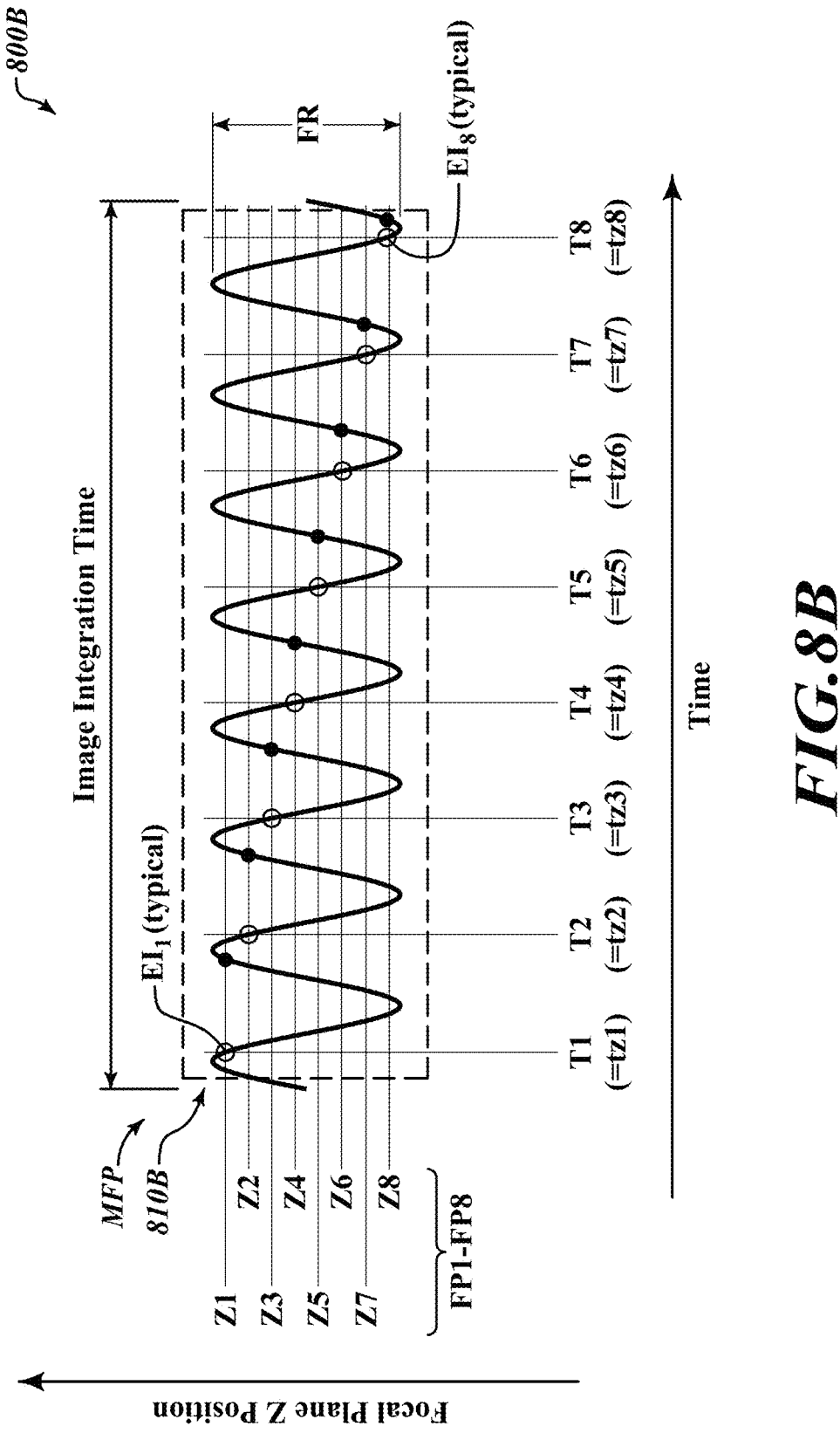

The diagram 800B of FIG. 8B has certain similarities to the diagram 800A of FIG. 8A, and will be understood by analogy, except as otherwise described below. In comparison to the diagram 800A, a primary difference of the diagram 800B is the utilization of a "double-pulsing" principle (e.g., which may correspondingly provide more light for the imaging at each of the focus positions Z1-Z8). More specifically, in the diagram 800B, the discrete image exposure increment $EI_1$ is acquired at the increment time T1, which has a phase timing tz1 that corresponds to the desired focus position FP=Z1. The periodically modulated focus position MFP then continues through one reversal of the direction of the focus position change during its periodic modulation following the increment time T1, before a "mirrored" discrete image exposure increment is acquired at an increment time, which has a phase timing that corresponds to the desired focus position FP=Z1 (i.e., for which the increment time and the phase timing are not labeled for simplicity of the illustration). Thus two discrete image exposure increments are provided at increment and phase timing that corresponds to the desired focus position FP=Z1. The acquisition of discrete image exposure increments EI continues in an analogous fashion through the acquisition of the discrete image exposure increment EI8 acquired at the increment time T8, which has a phase timing tz8 that corresponds to the desired focus position FP=Z8, and its corresponding "mirrored" discrete image exposure increment, which also has a phase timing that corresponds to the desired focus position FP=Z8. At this point, discrete image exposure increments $EI_1$-$EI_8$, and the corresponding mirrored discrete image exposure increments, have been acquired at each of the desired evenly spaced focus positions Z1-Z8 (forming 810B), during the image integration time. In this example, the image integration time is terminated at this point. It will be appreciated that this maintains even "image weighting" for each of the focus positions Z1-Z8 in the overall preliminary EDOF image exposure, which comprises the set 810B of discrete image exposure increments and/or evenly spaced focus positions. In various implementations, the image integration time may also or alternatively be referenced as the image acquisition time.

Figure 9A:
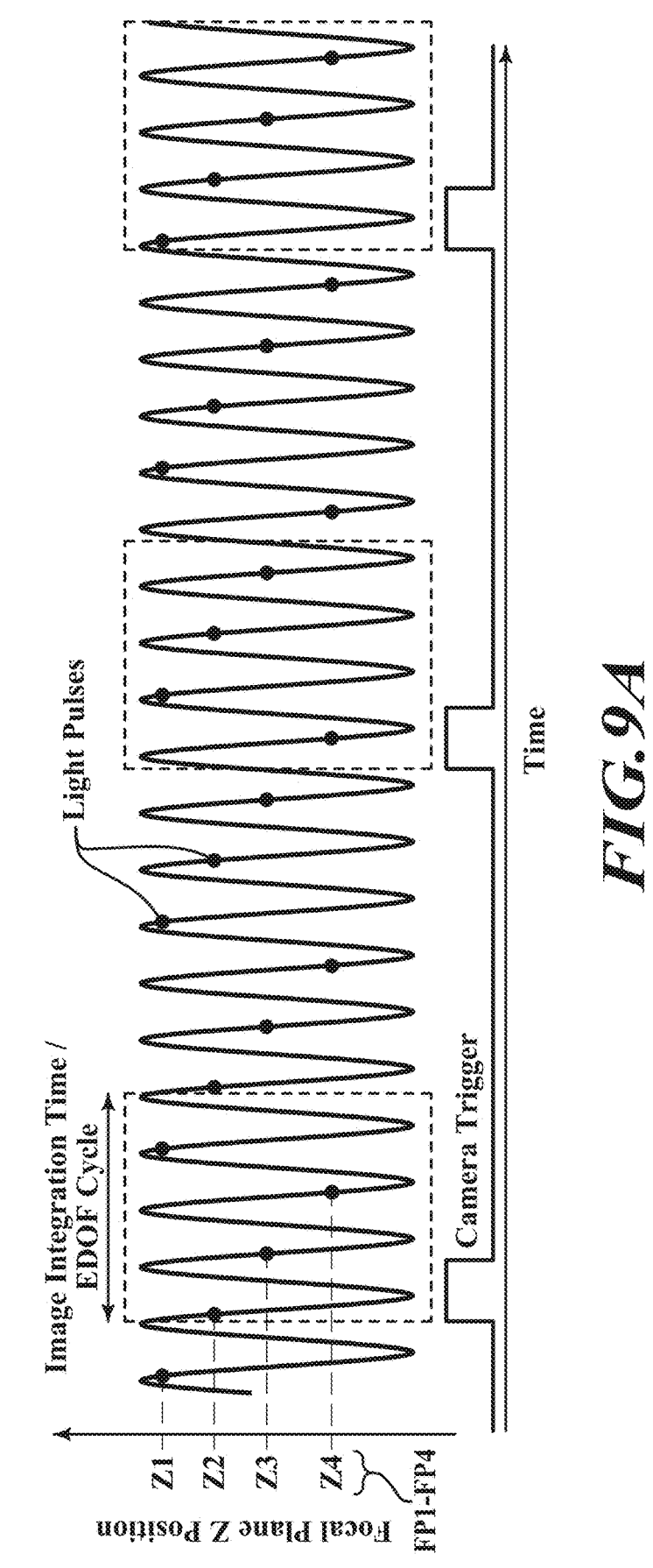
FIGS. 9A and 9B are timing diagrams illustrating aspects of image exposure implementations over multiple image integration times suitable for obtaining EDOF images.
Figure 9B:
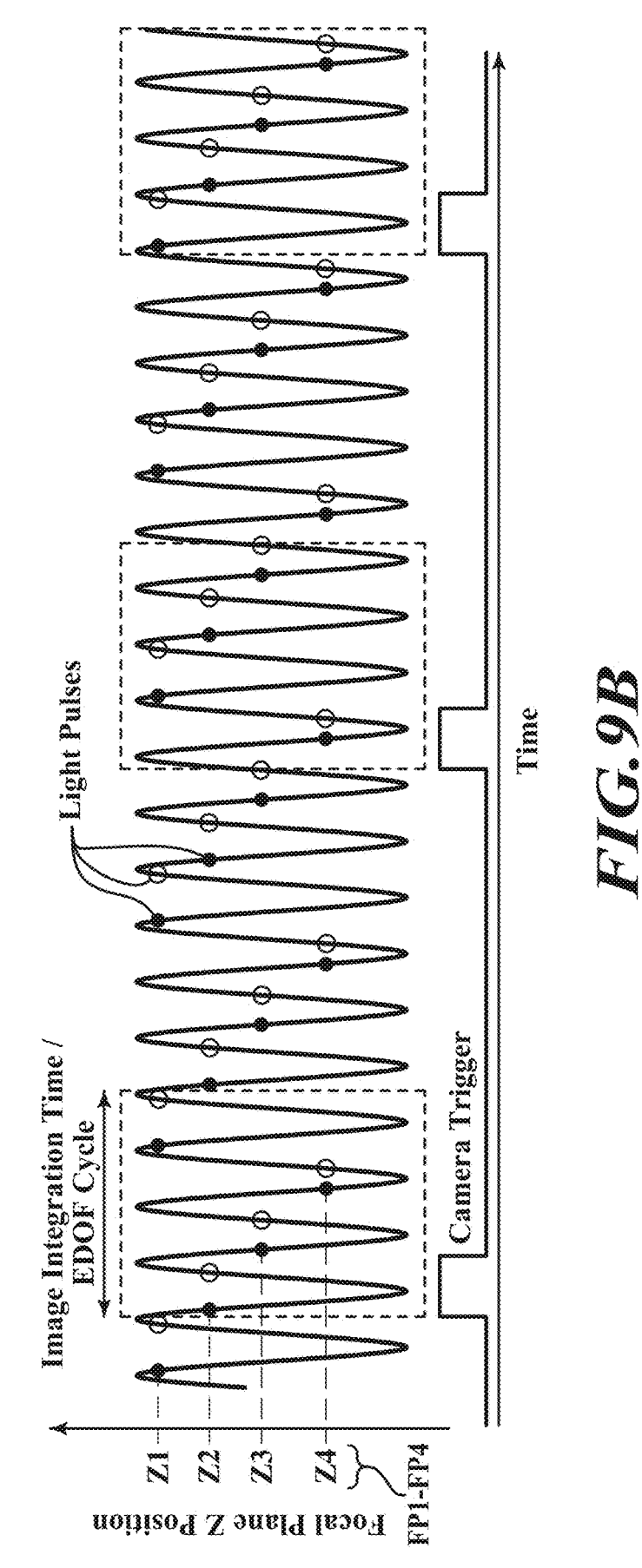

FIGS. 9A and 9B have certain similarities to FIGS. 8A and 8B, and will be understood by analogy, except as otherwise described below. Similar to FIG. 8A, FIG. 9A utilizes single pulses (e.g., single light pulses provided by the light source 330 of FIG. 5), and similar to FIG. 8B, FIG. 9B utilizes double pulses (e.g., double light pulses provided by the light source 330 of FIG. 5). The implementations of FIGS. 9A and 9B provide discrete image exposure increments for four focus positions Z1-Z4 (e.g., as compared to the eight focus positions of FIGS. 8A and 8B). FIGS. 9A and 9B also illustrate "Image Integration Time/EDOF Cycle" periods as occurring in relation to a camera trigger pulse (e.g., with three camera trigger pulses illustrated in each image, with three resulting "Image Integration Time/EDOF Cycle" periods. For each "Image Integration Time/EDOF Cycle" period, in FIG. 9A four discrete image exposure increments are illustrated (e.g., one each for the four focus positions Z1-Z4) and in FIG. 9B eight discrete image exposure increments are illustrated (e.g., two each for the four focus positions Z1-Z4). In the examples of FIGS. 9A and 9B, a comparison of the three illustrated "Image Integration Time/EDOF Cycle" periods indicates that they each include a same number of discrete image exposure increments for the four focus positions Z1-Z4. However, they may sometimes each start with a discrete image exposure increment for a different focus position (e.g., the first, second and third periods in the examples of FIGS. 9A and 9B are indicated as starting with discrete image exposure increments corresponding to the second, fourth and first focus positions).

Figure 10:
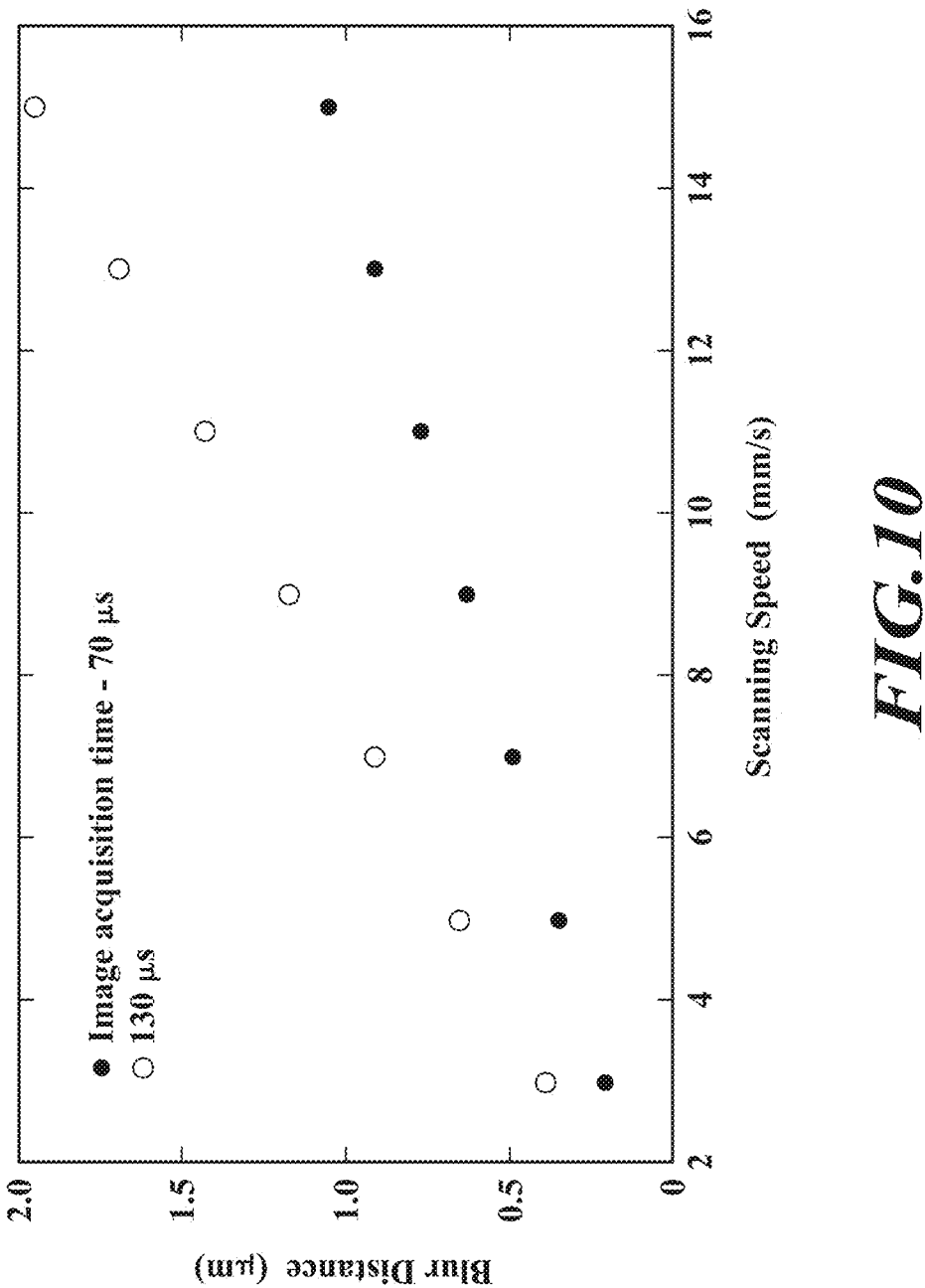
FIG. 10 is a diagram illustrating a dependence of motion-induced image blur on scanning speed and image acquisition time.

FIG. 10 is a diagram illustrating a dependence of a motion-induced image blur on the scanning speed and the image acquisition time. As illustrated, a first set of data points is for an image acquisition time of 70 us, and a second set of data points is for an image acquisition time of 130 us. As a general principle, as a scanning speed is increased (e.g., for a speed of motion along an inspection scan path for acquiring EDOF images at inspection points on a workpiece surface), a blur distance correspondingly increases. For a given scanning speed, the faster image acquisition time of 70 us results in less blur distance than the slower image acquisition time of 130 us. For a desired maximum blur distance for operations, FIG. 10 illustrates how a system can be configured with a certain image acquisition time and scanning speed to achieve such characteristics. For example, if system is to be configured with a maximum blur distance of 1.0 um, with an image acquisition time of 70 us, it may be desirable to have a scanning speed of at most 14 mm/s, while with an image acquisition time of 130 us, it may be desirable to have a scanning speed of at most 7 mm/s.

To support high inspection rates, the machine vision system may move continuously (i.e., for the relative movement between the inspection portion 300 and the workpiece 20). In certain implementations, it may be desirable to limit the image acquisition time/image integration time (i.e., for the inspection portion 300 acquiring the EDOF images of the inspection points) as much as possible to avoid resolution loss due to motion-induced image blur (e.g., as illustrated in FIG. 10, which as noted above shows a dependence of motion-induced image blur on the scanning speed and the image acquisition time, which limits the scanning speed of the inspection portion 300 for a specific image resolution). The inspection portion light source 330 also must provide sufficient light exposure for the image acquisition/image integration within a short timeframe (e.g., within a microsecond range). FIGS. 8A, 8B, 9A and 9B as described above illustrate implementations for providing such light exposure within a short timeframe (e.g., with the light source 330 emitting short light pulses, such as within a range of 5 ns to 100 ns for each of the light pulses, at the indicated times). FIGS. 8B and 9B illustrate implementations for enhancing illumination intensity by a factor of 2 during scanning (e.g., when following the inspection scan path ISP) in comparison to the implementations of FIGS. 8A and 9A.

Figure 11:
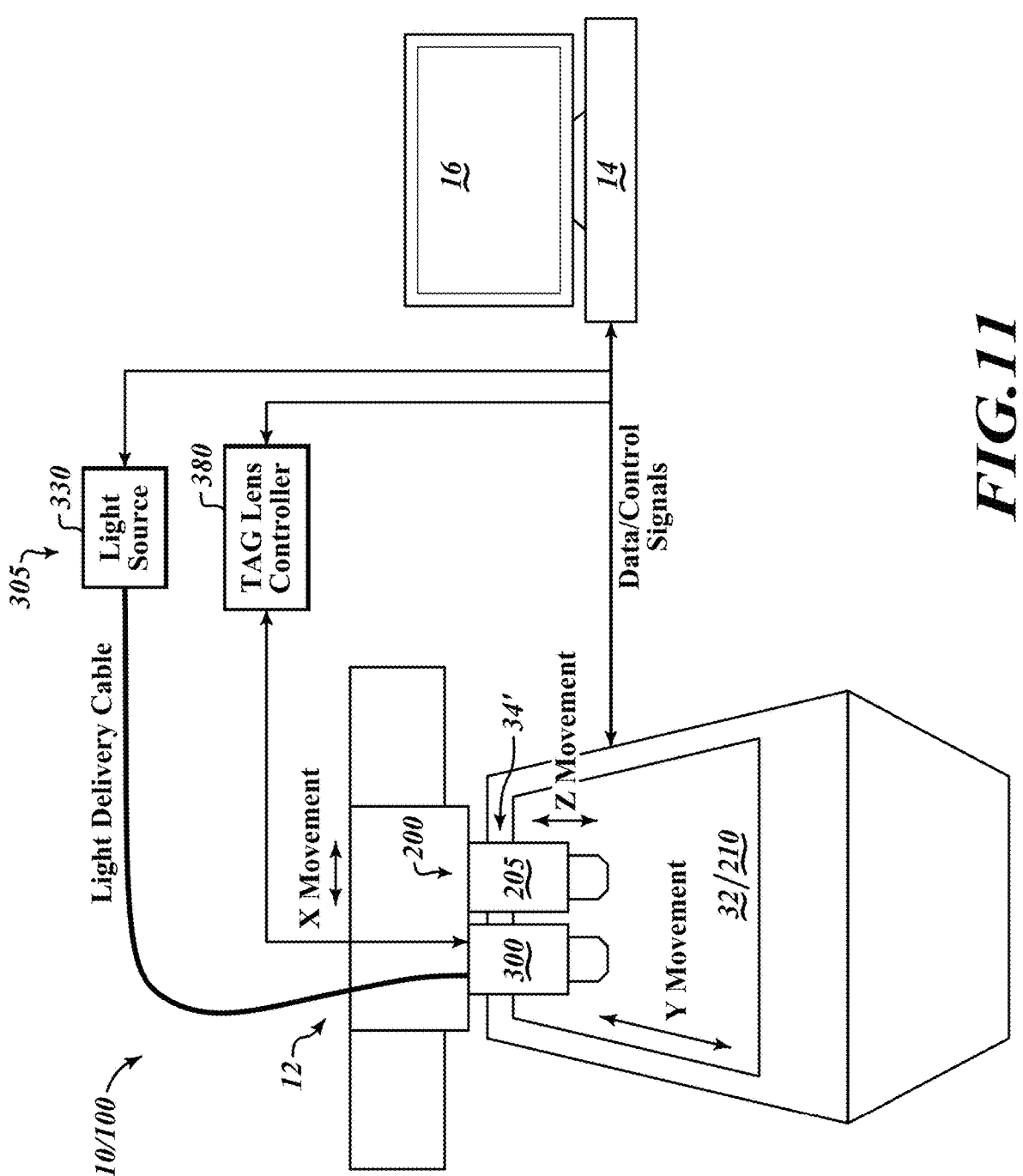
FIG. 11 is a diagram showing a machine vision system similar to that of FIG. 1, which includes a vision components portion for performing an autofocus process and an inspection portion for performing an inspection process.

FIG. 11 is a diagram showing a machine vision system 10/100 similar to that of FIG. 1 including a vision measuring machine 12. The vision measuring machine 12 includes a vision components portion 200 for performing an autofocus process, an inspection portion 300 for performing an inspection process, and X, Y and Z movement mechanisms. The vision components portion 200 includes an optical imaging system 34' (e.g., including at least an optical assembly portion 205 and one or more light sources) and a workpiece stage 32/210. The Z movement mechanism (e.g., movement mechanism 294Z) is for effecting Z movement of the optical assembly portion 205 and the inspection portion 300 relative to the moveable workpiece stage 32/210 (e.g., to change a distance between the inspection portion 300 and a surface of a workpiece placed on the moveable workpiece stage 32/210).

In the illustrated arrangement, the Y movement mechanism (e.g., the movement mechanism 294XY) effects y-axis movement of the moveable workpiece stage 32/210, and the X movement mechanism (e.g., as part of the vision measuring machine 12) effects x-axis movement of the optical assembly portion 205 and the inspection portion 300 relative to the moveable workpiece stage 32/210. In the illustrated arrangement, the optical assembly portion 205 may be included in or otherwise mounted to a turret (e.g., the main turret) of the optical imaging system 34 while the inspection portion 300 may be mounted to the side of the main turret and/or optical assembly portion 205 to thereby move with the optical assembly portion 205 up and down in the z-axis direction as well as sideways in the x-axis direction. The vision measuring machine 12 is operably connected to exchange data and control signals with a controlling computer system 14. The controlling computer system 14 is further operably connected to exchange data and control signals with a monitor or display 16.

As described above (e.g., with respect to FIG. 5) the inspection portion 300 includes a variable focal length (VFL) lens such as a TAG lens (not shown), a VFL lens controller 380 configured to control the VFL lens, and an inspection portion light source 330 configured to provide (e.g., via a light delivery cable), source light for illuminating a workpiece placed on the moveable workpiece stage 32/210. As shown in the earlier figures and as described above, the vision components portion 200 and the inspection portion 300 may include further or alternative configurations or components.

FIG. 12A is a schematic diagram illustrating use of the vision components portion 200 with the optical assembly portion 205 of FIG. 11 to perform an autofocus process which indicates z-heights of a plurality of sampling points SP on a surface of a workpiece 20 for determining coarse surface profile data for the surface of the workpiece, for which a sampling scan path SSP is followed. In the illustrated autofocus process, the sampling scan path SSP entails moving the vision components portion 200 over the workpiece 20 (e.g., at least partially in the x-axis direction) to quickly determine the coarse surface profile data for the surface of the workpiece 20. Certain operations/alternatives of such an autofocus process are described above (e.g., with respect to FIGS. 3, 4A and 4B), for which the specifics of the autofocus process that is performed and the variations in the workpiece will determine the x, y and z-axis movements along the sampling scan path SSP. In some instances, z-axis movements along the sampling scan path SSP may be relatively limited (e.g., as primarily performed at relatively sparsely located sampling points SP) and/or for which the total time for the movement over the sampling scan path SSP may be relatively short and/or otherwise performed relatively quickly.

FIG. 12B is a schematic diagram illustrating use of the inspection portion 300 of FIG. 11 to perform an inspection process, which includes acquiring an extended depth of field (EDOF) image for each inspection point IP of a plurality of inspection points IP on the surface of the workpiece 20, and for which an inspection scan path ISP is followed. As illustrated, the inspection scan path ISP includes adjustments in relation to the distance between the inspection portion 300 and the surface of the workpiece 20 in the z-axis direction and is determined based at least in part on the coarse surface profile data from the autofocus process of FIG. 12A. The adjustments in the z-axis direction keep the surface of the workpiece 20 roughly at the correct distance relative to the inspection portion 300 such that the variations of the workpiece surface height remain within the focus range corresponding to the operations of the VFL lens. In the example of FIG. 12B, the inspection portion 300 is indicated as being over an inspection point IP, and for which the inspection point IP is within an indicated focus range of the inspection portion 300 (e.g., similar to the focus range Refp as described above with respect to FIG. 5). It will be appreciated that movements of the inspection portion 300 along the inspection scan path ISP (e.g., including the corresponding movements/adjustments of the inspection portion 300 along the z-axis direction) are configured to keep the inspection points IP on the surface of the workpiece 20 within the indicated scan range (e.g., near the middle of the scan range) of the inspection portion 300 (e.g., to enable the acquiring of the desired EDOF images at the inspection points IP). Generally, the number of inspection points IP used in the inspection process is more (e.g., more dense/frequent) than the number of sampling points SP used in the autofocus process. Further, as illustrated, the inspection points IP need not be evenly spaced and may be selected by a user, for example, for inspecting particular locations/features on the surface of the workpiece 20, as will be described in more detail below with respect to FIG. 13.

Figure 13:
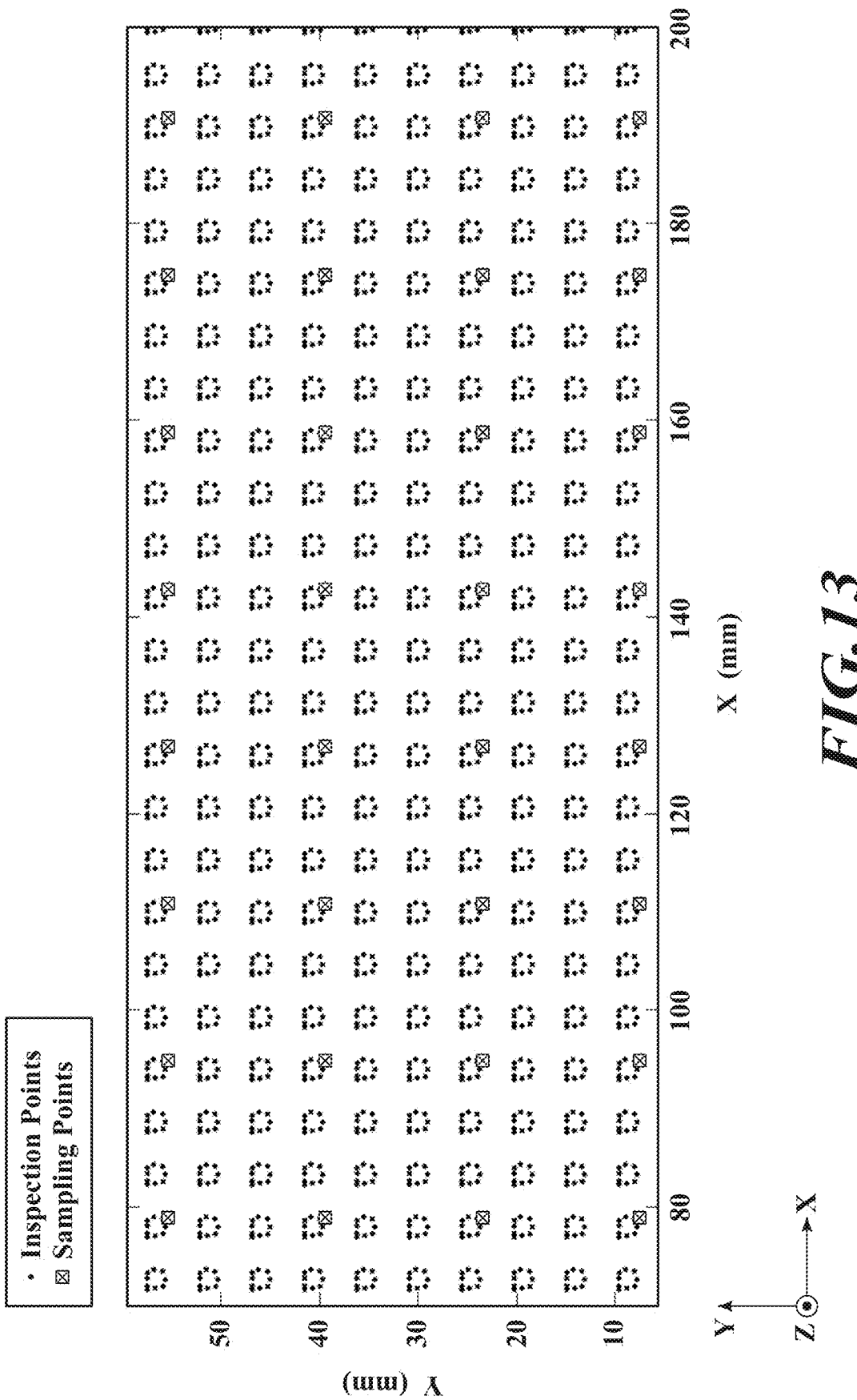
FIG. 13 is a top view of one example arrangement of sampling points SP used in an autofocus process and inspection points IP used in an inspection process on a surface of a workpiece.

FIG. 13 is a top view of one example arrangement of sampling points SP used in an autofocus process and inspection points IP used in an inspection process on the surface of the workpiece 20. The illustrated example includes thirtytwo (32) sampling points SP, and two thousand one hundred and sixty (2160=9×10×24) inspection points IP.

In exemplary embodiments, the plurality of sampling points SP are determined based at least in part on the plurality of inspection points IP as specified by a user. For example, once the plurality of inspection points IP are received, the machine vision system 10 may determine the plurality of sampling points SP, which are fewer than the number of inspection points IP, and such as to provide a coarse sampling of the area of the workpiece surface on which the inspection points IP are located, for determining a general surface profile in that area. Areas of the workpiece surface that do not have any inspection points IP may correspondingly not have any sampling points SP designated, and in some instances at least some sampling points SP may or may not be in same locations as inspection points IP. In some instances, sampling points SP may be determined according to a pattern and/or may be evenly spaced for generally sampling a designated area (e.g., as illustrated in FIG. 13). On the other hand, inspection points IP may be for inspecting certain workpiece features and may be in configurations or patterns with shapes similar to those of the workpiece features that are being inspected, such as in FIG. 13 where the inspection points IP are in circular/annular patterns for inspecting circular/annular workpiece features.

For performing the autofocus process at each of the sampling points SP, the optical assembly portion 205 may move along a sampling scan path SSP relative to the workpiece surface. For example, in FIG. 13, in one implementation the sampling scan path SSP may include the relative movements (i.e., between the optical assembly portion 205 and the workpiece 20) including moving along a top row of eight sampling points SP from left to right, then moving along the next row of eight sampling points SP from right to left, then moving along the next row of eight sampling points SP from left to right, then moving along the next row of eight sampling points SP from right to left. In contrast, in FIG. 13, in one implementation of an inspection scan path ISP, the relative movements (i.e., between the inspection portion 300 and the workpiece 20) may include movements to follow the patterns of inspection points as specified by a user. As noted above, the inspection scan path ISP also includes movements along the z-axis direction, for maintaining the distance between the inspection portion 300 and the workpiece 20 to be within the scan range corresponding to the operations of the VFL lens of the inspection portion 300 (e.g., to enable the corresponding acquisition of the EDOF images by the inspection portion 300, such as at each of the inspection points IP on the workpiece surface).

As noted above, the movements in the z-axis direction along the inspection scan path ISP may be determined based at least in part on the coarse surface profile data from the sampling process. In some implementations, for some or all of the inspection points, an estimated z-height of each inspection point may be determined based on the coarse surface profile data. For example, for an inspection point IP with XY coordinates that fall between the XY coordinates of nearby sampling points SP, interpolation or other techniques may be utilized to estimate the z-height of the inspection point (or a location close to the inspection point). Based on such an estimated z-height of an inspection point, the determination of the inspection scan path ISP may include a z-axis/z-height adjustment when approaching the inspection point IP such that the estimated z-height of the inspection point IP will be within the focus range of the operation of the VFL lens of the inspection portion 300 (i.e., for acquiring the EDOF image at the inspection point IP). The inspection scan path ISP may be determined with such z-height adjustments being performed as needed based on the estimated z-heights (e.g., of some or all of the inspection points and/or locations near the inspection points). As a result, as the inspection scan path ISP includes XY movements over portions of the workpiece surface with z-height variances, and as the distance between the particular inspection points on the workpiece surface and the inspection portion 300 would correspondingly vary, the movements in the z-height direction (e.g., based on the estimated z-heights of the inspection points) may be performed to adjust the distance to be maintained/back within the focus range of the operations of the VFL lens of the inspection portion 300.

In various implementations, any differences between the estimated z-heights and the actual z-heights of the inspection points IP are intended/configured to be small enough such that the actual z-heights of the inspection points will fall within the focus range of the operations of the VFL lens of the inspection portion 300, such that the desired EDOF images at each of the inspection points IP may be acquired. In relation to such desired accuracies, a number of sampling points SP (e.g., as determined by the system and to be included as part of the sampling scan path SSP) may be more or less depending on the particular surface of the workpiece to be inspected. For example, relatively fewer sampling points may be utilized for workpiece surfaces with fewer or relatively minimal z-height variations, while relatively more sampling points may be utilized for workpiece surfaces with larger and/or more frequent z-height variations, such as for increasing the accuracy of the coarse surface profile data (e.g., so as to correspondingly increase the accuracy of the estimated z-heights of the inspection points IP as utilized for determining the inspection scan path ISP). In various implementations, a balance is determined between a desired speed for performing the autofocus process (e.g., for which the number of sampling points corresponds to how fast the autofocus process can be performed) and a desired accuracy of the coarse surface profile data (e.g., for which a sufficient number of sampling points are determined and utilized for achieving a desired accuracy). In various implementations, the number of inspection points IP may be more than 2×, or 5×, or 10×, or 20× the number of sampling points SP (e.g., see the example of FIG. 13).

FIG. 14 is a flow diagram illustrating a method 1400 for operating a machine vision system 10 including a step of utilizing the vision components portion 200 to perform an autofocus process and a step of utilizing the inspection portion 300 to perform an inspection process.

Specifically, step 1410 includes utilizing a vision components portion 200 to perform an autofocus process which indicates z-heights of a plurality of sampling points SP on the surface of the workpiece 20 for determining coarse surface profile data for the surface of the workpiece 20, and for which a sampling scan path SSP is followed.

Step 1420 includes utilizing an inspection portion 300 to perform an inspection process, which comprises acquiring an extended depth of field (EDOF) image for each inspection point IP of a plurality of inspection points IP (e.g., as specified by a user) on the surface of the workpiece 20, and for which an inspection scan path ISP is followed. The inspection scan path ISP includes adjustments in relation to the distance (e.g., utilizing the movement mechanism 294Z) between the inspection portion 300 and the surface of the workpiece 20 and is determined based at least in part on the coarse surface profile data from the autofocus process of step 1410.

Figure 15:
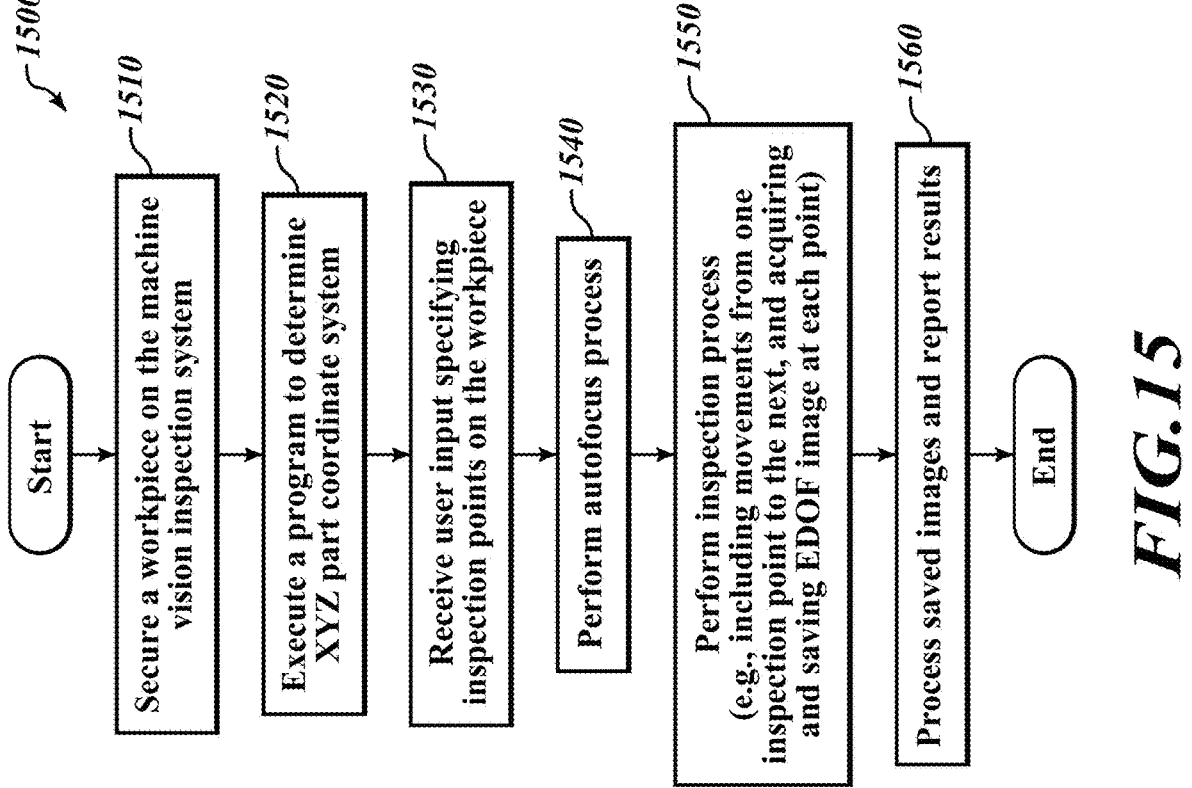
FIG. 15 is a flow diagram illustrating one embodiment of a routine for operating a machine vision system to perform an autofocus process and to perform an inspection process, and to process saved images and report results.

FIG. 15 is a flow diagram illustrating one embodiment of a routine 1500 for operating a machine vision system 10 to perform an autofocus process and to perform an inspection process, wherein the inspection process includes acquiring an extended depth of field (EDOF) image for each inspection point IP along an inspection scan path ISP.

The machine vision system 10 may be configured as described above. In exemplary embodiments, the machine vision system 10 enables high-speed and high-resolution inspection of complex workpieces having height variation and may include:

i) capabilities (e.g., using QUICK VISION®) for stop-and-shoot imaging or continuous scanning imaging;

ii) a vision components portion used for an autofocus process for fast and coarse (low-density) surface profile measurement to account for surface height (z-axis) variation beyond a range of a varifocal imaging system;

iii) an inspection portion for performing an inspection process and equipped with fast varifocal element (VFL/TAG) capable of acquiring an extended depth of focus (EDOF) image within anywhere between 30 to 500 microseconds (e.g., for a 70 Khz TAG operating frequency, and which may be even faster for higher TAG operating frequencies), without or with very limited motion-induced blur and motion-induced and workpiece-induced defocusing, and which includes a light source (e.g., white light, or selected wavelength, or range of wavelengths) that illuminates the workpiece during EDOF image acquisition within a few 10 s or 100 s of microseconds (e.g., and for which the actual illumination time may be closer to <1 microsecond or 800 nanoseconds) and enables recording images of the workpiece with good signal-to-noise (SNR) and with minimal motion blur; and iv) functionality (e.g., QVSTREAM®) that allows for continuous workpiece scanning and image registration while in motion at precisely defined points in 3D.

In some implementations, certain workpieces (e.g., dark, highly scattering, etc.) may require relatively more light (e.g., 10×, 100×, etc.) to image (e.g., as compared to an LED light source), in particular for high throughput. As such, in certain implementations the light source 330 may be configured to include brighter light source technologies (e.g., laser, super continuum laser, super luminescent diode, etc.). With such technologies, the light source 330 may be enabled to have high repetition rates (e.g., of 1 MHZ+, such as may enable all EDOF planes to be captured in a single VFL/TAG cycle). As some related concepts, in relation to the AF and TAF sensors/processes as described above with respect to FIGS. 3, 4A and 4B, it may also be desirable to utilize a relatively brighter sensor technology. For example, a TAF sensor utilizing a laser may be included in such implementations.

The routine 1500 for operating the machine vision system 10 includes generally six steps. Step 1510 includes securing a workpiece 20 on the machine vision system 10 (e.g., on the moveable workpiece stage 32/210). Step 1520 includes executing a program to determine XYZ part coordinate system of the machine vision system 10 (e.g., to support precise adjustments in the relative locations between the optical imaging system 34 and the surface of the workpiece 20). Step 1530 includes receiving user input specifying inspections points IP on the workpiece 20 for use in performing an inspection process. In exemplary embodiments, once the plurality of inspection points IP are received, the machine vision system 10 determines a plurality of sampling points SP, which are fewer than the number of inspection points IP and determined so as to provide a coarse sampling
of the area of the workpiece surface on which the inspection
points IP are located. Step 1540 includes performing an
autofocus process using the vision components portion 200
and using the determined plurality of sampling points SP.
Step 1550 includes performing the inspection process using
the inspection points IP, which may be input in step 1530
above. For example, the inspection process may include
moving from one inspection point IP to the next inspection
point IP and acquiring and saving EDOF images. Step 1560
includes processing the saved EDOF images and reporting
results of the inspection process. For example, workpiece
features of interest may be extracted, measured, and/or
detected utilizing various algorithms and reported in various
forms.

The following describes various exemplary embodiments
of the present disclosure with various features and elements
annotated with reference numerals found in FIGS. 1-15. It
should be understood that the reference numerals are added
to indicate exemplary embodiments, and the features and
elements are not limited to the particular embodiments
illustrated in FIGS. 1-15.

In various implementations, a movement mechanism
294Z (e.g., of FIG. 2) is configured to move the inspection
portion 300 in the z-axis direction for the adjustments in the
distance between the inspection portion 300 and the surface
of the workpiece 20 as part of the movements along the
inspection scan path. The movement mechanism 294Z may
also be configured to move the optical assembly portion 205
in the z-axis direction, for which the inspection portion 300
is mounted to the optical assembly portion 205 (e.g., as
mounted to a frame).

In various implementations, the periodic modulation of
the focus position of the inspection portion 300 is over a
focus range Refp, and the adjustments in the distance (e.g.,
utilizing the movement mechanism 294Z) between the
inspection portion 300 and the surface of the workpiece 20
are performed during the inspection process so that each
inspection point IP on the workpiece surface will be within
the focus range Refp of the inspection portion 300 when the
EDOF image is acquired for the inspection point IP. As
shown in FIG. 5, by using the periodic modulation of a
signal to drive the VFL lens 370, the effective focus position
EFP of the imaging system 300 (that is, the focus position in
front of the objective lens 350) may be rapidly moved within
a range Refp (e.g., a focus range or an autofocus search
range, etc.) bound by an effective focus position EFP1 (or
EFPmax or peak focus distance Z1max+) corresponding to
a maximum positive optical power of the VFL lens 370 in
combination with the objective lens 350, and an effective
focus position EFP2 (or EFPmin or peak focus distance
Z1max−) corresponding to a maximum negative optical
power of the VFL lens 370 in combination with the objective
lens 350.

In various implementations, the sampling scan path SSP
is different than the inspection scan path ISP. The inspection
scan path ISP may include movements to coordinates (e.g.,
XYZ coordinates for imaging inspection points IP) that the
sampling scan path SSP does not include movements to.

In various implementations, the optical assembly portion
205 comprises an optical assembly objective lens 250 hav-
ing an optical axis OA. The optical assembly portion 205
may further comprise an optical assembly light source 230
which is configured to provide source light 232 for illumi-
nating the workpiece 20. The optical assembly objective lens
250 may be configured to input workpiece light 255 arising
from the surface of a workpiece 20 as illuminated by the source light 232, and to transmit the workpiece light 255
along an imaging optical path OPATH of the optical assem-
bly portion, wherein the optical axis OA corresponds to a
z-axis direction for which surface points on the surface of
the workpiece 20 have corresponding z-heights along the
z-axis direction. The optical assembly portion 205 may
further comprise an optical assembly camera (e.g., of the
camera system 260) that is configured to receive workpiece
light 255 transmitted along the imaging optical path OPATH
and to provide images of the workpiece surface.

In various implementations, the autofocus process that the
optical assembly portion 205 of the vision components
portion is configured to be utilized to perform comprises at
least one of: collecting an image stack; or utilizing a tracking
autofocus sensor (e.g., as included in the tracking autofocus
portion 1000 of FIG. 3). For the collecting of an image stack,
in various implementations at each sampling point SP the
movement mechanism 294Z may be utilized to move the
optical assembly portion 205 along the z-axis direction for
capturing the image stack which includes images captured at
different focus positions. For each image, a focus metric may
be calculated based on the image and may be related to a
corresponding position (e.g., of the camera or other part of
the optical assembly portion 205 or a reference point) along
the z-axis at the time that the image was captured. A focus
curve may be determined as corresponding to the calculated
focus metrics, for which the peak of the focus curve may
correspond to a best focus position along the z-axis.

In various implementations, the acquiring of each
extended depth of field (EDOF) image (i.e., for each of the
inspection points IP) by the inspection portion 300 com-
prises: operating the VFL lens controller 380 to periodically
modulate a focus position of the inspection portion 300;
exposing a first preliminary image using an image exposure
comprising a plurality of discrete image exposure incre-
ments acquired at respective discrete focus positions during
an image integration time comprising a plurality of periods
of the periodically modulated focus position; and processing
the first preliminary image to remove blurred image contri-
butions occurring in the focus range during the image
integration time to provide an extended depth of field
(EDOF) image that is substantially focused throughout a
larger depth of field than the inspection portion 300 provides
at a single focal position. In various implementations, the
plurality of discrete image exposure increments are each
determined by a respective instance of a strobe operation of
the inspection portion light source 330. In various imple-
mentations, the EDOF images may be further processed. For
example, the images may be segmented, with the blurred
image contributions removed, and analyzed (e.g., features of
interest may be extracted, measured, and/or detected utiliz-
ing various algorithms, etc.).

In various implementations, the machine vision system
10/100 includes a vision measuring machine 12 with a
moveable workpiece stage 32/210 and an optical imaging
system 34 (e.g., including a vision components portion 200,
a movement mechanism 294Z, etc.) In the illustrations of
FIGS. 12A and 12B, it will be appreciated that the workpiece
20 may be located on the stage 32/210 (e.g., as moved by a
movement mechanism 294XY).

It will be appreciated that the principles disclosed and
claimed herein may be readily and desirably combined with
various features disclosed in the incorporated references.
The various implementations described above can be com-
bined to provide further implementations. All of the U.S.
patents and U.S. patent applications referred to in this
specification are incorporated herein by reference, in their entirety. Aspects of the implementations can be modified, if necessary to employ concepts of the various patents and applications to provide yet further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled.

The invention claimed is:

1. A machine vision system, comprising:
a vision components portion, comprising an optical assembly portion;
a movement mechanism; and
an inspection portion that is coupled to the optical assembly portion, comprising:
a variable focal length (VFL) lens;
a VFL lens controller configured to control the VFL lens to periodically modulate an optical power of the VFL lens over a range of optical powers at an operating frequency so as to periodically modulate a focus position of the inspection portion;
an inspection portion light source which is configured to provide source light for illuminating a workpiece;
an inspection portion objective lens having an optical axis and that is configured to input workpiece light arising from the workpiece, and to transmit the workpiece light along an imaging optical path that passes through the VFL lens, wherein the optical axis corresponds to a z-axis direction for which surface points on a surface of the workpiece have corresponding z-heights along the z-axis direction;
an inspection portion camera that is configured to receive the workpiece light transmitted by the VFL lens along the imaging optical path and to provide a corresponding workpiece image exposure;
wherein:
the vision components portion is configured to be utilized to perform an autofocus process which indicates z-heights of a plurality of sampling points SP on the surface of the workpiece for determining coarse surface profile data for the surface of the workpiece, and for which a sampling scan path SSP is followed; and
the inspection portion is configured to be utilized to perform an inspection process, which comprises acquiring an extended depth of field (EDOF) image for each inspection point IP of a plurality of inspection points IP on the surface of the workpiece, and for which an inspection scan path ISP is followed which includes adjustments in relation to the distance between the inspection portion and the surface of the workpiece and is determined based at least in part on the coarse surface profile data from the autofocus process.

2. The machine vision system of claim 1, wherein the movement mechanism is configured to move the inspection portion in the z-axis direction for the adjustments in relation to the distance between the inspection portion and the surface of the workpiece as part of the movements along the inspection scan path ISP.

3. The machine vision system of claim 2, wherein the movement mechanism is also configured to move the optical assembly portion in the z-axis direction, for which the inspection portion is mounted to the optical assembly portion.

4. The machine vision system of claim 1, wherein:
the periodic modulation of the focus position of the inspection portion is over a focus range; and
the adjustments in relation to the distance between the inspection portion and the surface of the workpiece are performed during the inspection process so that each inspection point IP on the surface of the workpiece will be within the focus range of the inspection portion when the EDOF image is acquired for the inspection point IP.

5. The machine vision system of claim 1, wherein the sampling scan path SSP is different than the inspection scan path ISP.

6. The machine vision system of claim 5, wherein the inspection scan path ISP includes movements to coordinates that the sampling scan path SSP does not include movements to.

7. The machine vision system of claim 1, wherein the number of inspection points IP is more than twice the number of sampling points SP.

8. The machine vision system of claim 1, wherein the optical assembly portion comprises an optical assembly objective lens having an optical axis.

9. The machine vision system of claim 8, wherein the optical assembly portion further comprises an optical assembly light source which is configured to provide optical assembly source light for illuminating the workpiece; and wherein the optical assembly objective lens is configured to input workpiece light arising from the surface of the workpiece as illuminated by the optical assembly source light, and to transmit the workpiece light along an imaging optical path of the optical assembly portion.

10. The machine vision system of claim 9, wherein the optical assembly portion further comprises an optical assembly camera that is configured to receive the workpiece light transmitted along the imaging optical path and to provide images of the surface of the workpiece.

11. The machine vision system of claim 1, wherein the autofocus process that the optical assembly portion is configured to be utilized to perform comprises at least one of:
collecting an image stack; or
utilizing a tracking autofocus sensor.

12. The machine vision system of claim 1, wherein the acquiring of each extended depth of field (EDOF) image by the inspection portion comprises:
operating the VFL lens controller to periodically modulate the focus position of the inspection portion;
exposing a first preliminary image using an image exposure comprising a plurality of discrete image exposure increments acquired at respective discrete focus positions during an image integration time comprising a plurality of periods of the periodically modulated focus position; and
processing the first preliminary image to remove blurred image contributions occurring in a focus range during the image integration time to provide an extended depth of field (EDOF) image that is substantially focused throughout a larger depth of field than that which the inspection portion provides at a single focal position.

13. The machine vision system of claim 12, wherein the plurality of discrete image exposure increments are each determined by a respective instance of a strobe operation of the inspection portion light source.

14. The machine vision system of claim 1, wherein the VFL lens is a tunable acoustic gradient (TAG) lens.

15. A method for operating a machine vision system, the machine vision system comprising:

a vision components portion, comprising an optical assembly portion;

a movement mechanism; and an inspection portion that is coupled to the optical assembly portion, comprising:

a variable focal length (VFL) lens;

a VFL lens controller configured to control the VFL lens to periodically modulate an optical power of the VFL lens over a range of optical powers at an operating frequency so as to periodically modulate a focus position of the inspection portion;

an inspection portion light source which is configured to provide source light for illuminating a workpiece;

an inspection portion objective lens having an optical axis and that is configured to input workpiece light arising from the workpiece, and to transmit the workpiece light along an imaging optical path that passes through the VFL lens, wherein the optical axis corresponds to a z-axis direction for which surface points on a surface of the workpiece have corresponding z-heights along the z-axis direction; and an inspection portion camera that is configured to receive the workpiece light transmitted by the VFL lens along the imaging optical path and to provide a corresponding workpiece image exposure;

the method comprising:

utilizing the vision components portion to perform an autofocus process which indicates z-heights of a plurality of sampling points SP on the surface of the workpiece for determining coarse surface profile data for the surface of the workpiece, and for which a sampling scan path SSP is followed; and utilizing the inspection portion to perform an inspection process, which comprises acquiring an extended depth of field (EDOF) image for each inspection point IP of a plurality of inspection points IP on the surface of the workpiece, and for which an inspection scan path ISP is followed which includes adjustments in relation to the distance between the inspection portion and the surface of the workpiece and is determined based at least in part on the coarse surface profile data from the autofocus process.

16. The method of claim 15, wherein the movement mechanism is utilized to move the inspection portion in the z-axis direction for the adjustments in relation to the distance between the inspection portion and the surface of the workpiece as part of the movements along the inspection scan path ISP.

17. The method of claim 15, wherein:

the periodic modulation of the focus position of the inspection portion is over a focus range; and the adjustments in relation to the distance between the inspection portion and the surface of the workpiece are performed during the inspection process so that each inspection point IP on the surface of the workpiece will be within the focus range of the inspection portion when the EDOF image is acquired for the inspection point IP.

18. The method of claim 15, wherein the sampling scan path SSP is different than the inspection scan path ISP and the number of inspection points IP is more than twice the number of sampling points SP.

19. The method of claim 15, wherein the acquiring of each extended depth of field (EDOF) image by the inspection portion comprises:

operating the VFL lens controller to periodically modulate the focus position of the inspection portion;

exposing a first preliminary image using an image exposure comprising a plurality of discrete image exposure increments acquired at respective discrete focus positions during an image integration time comprising a plurality of periods of the periodically modulated focus position; and processing the first preliminary image to remove blurred image contributions occurring in a focus range during the image integration time to provide an extended depth of field (EDOF) image that is substantially focused throughout a larger depth of field than that which the inspection portion provides at a single focal position.

20. A metrology system, comprising:

a vision components portion, comprising an optical assembly portion;

a movement mechanism;

an inspection portion that is coupled to the optical assembly portion, comprising:

a variable focal length (VFL) lens;

a VFL lens controller configured to control the VFL lens to periodically modulate an optical power of the VFL lens over a range of optical powers at an operating frequency so as to periodically modulate a focus position of the inspection portion;

an inspection portion light source which is configured to provide source light for illuminating a workpiece;

an inspection portion objective lens having an optical axis and that is configured to input workpiece light arising from the workpiece, and to transmit the workpiece light along an imaging optical path that passes through the VFL lens, wherein the optical axis corresponds to a z-axis direction for which surface points on a surface of the workpiece have corresponding z-heights along the z-axis direction; and an inspection portion camera that is configured to receive the workpiece light transmitted by the VFL lens along the imaging optical path and to provide a corresponding workpiece image exposure;

a memory for storing programmed instructions; and one or more processors to execute the programmed instructions to perform operations including:

utilizing the vision components portion to perform an autofocus process which indicates z-heights of a plurality of sampling points SP on the surface of the workpiece for determining coarse surface profile data for the surface of the workpiece, and for which a sampling scan path SSP is followed; and utilizing the inspection portion to perform an inspection process, which comprises acquiring an extended depth of field (EDOF) image for each inspection point IP of a plurality of inspection points IP on the surface of the workpiece, and for which an inspection scan path ISP is followed which includes adjustments in relation to the distance between the inspection portion and the surface of the workpiece and is determined based at least in part on the coarse surface profile data from the autofocus process.

* * * * *